(12) United States Patent
Li et al.

(10) Patent No.: US 11,810,509 B2
(45) Date of Patent: Nov. 7, 2023

(54) BACKPLANE AND METHOD FOR PULSE WIDTH MODULATION

(71) Applicant: GOOGLE LLC, Mountain View, CA (US)

(72) Inventors: Jeffrey Li, Santa Clara, CA (US); Robert Lo, Santa Clara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/865,298

(22) Filed: Jul. 14, 2022

(65) Prior Publication Data

US 2023/0027570 A1  Jan. 26, 2023

Related U.S. Application Data

(60) Provisional application No. 63/221,536, filed on Jul. 14, 2021.

(51) Int. Cl.
*G09G 3/3233* (2016.01)
*G11C 19/28* (2006.01)

(52) U.S. Cl.
CPC ........... *G09G 3/3233* (2013.01); *G11C 19/28* (2013.01); *G09G 2300/0842* (2013.01); *G09G 2310/0286* (2013.01)

(58) Field of Classification Search
None
See application file for complete search history.

(56) References Cited

U.S. PATENT DOCUMENTS

| 2,403,731 A | 7/1946 | Macneille |
| 3,936,817 A | 2/1976 | Levy et al. |
| 4,432,610 A | 2/1984 | Kobayashi et al. |

(Continued)

FOREIGN PATENT DOCUMENTS

| EP | 0658870 A2 | 12/1994 |
| EP | 1187087 A1 | 3/2002 |

(Continued)

OTHER PUBLICATIONS

U.S. Appl. No. 10/957,272 filed Mar. 23, 2021, Li et al.

(Continued)

*Primary Examiner* — Dorothy Harris
(74) *Attorney, Agent, or Firm* — Brake Hughes Bellermann LLP

(57) ABSTRACT

A backplane for driving a display includes a two-dimensional array of pixel drive circuits, organized as a plurality of rows and a plurality of columns. The backplane has at least one shift register addressing assembly that includes a shift register chain formed of a plurality of controlling shift registers serially connected with, and separated by, equal sized groups of non-controlling shift registers. Each controlling shift register controls a different one of a plurality of word lines that each connect with pixel drive circuits of one row. The backplane also includes a plurality of bit lines that each connect with pixel drive circuits of one column. A shift register data sequence is input to a first one of the plurality of controlling shift registers and propagates through the shift register chain to control the plurality of word lines to load display values from the bit lines into the pixel drive circuits.

19 Claims, 24 Drawing Sheets

(56) References Cited

U.S. PATENT DOCUMENTS

| | | |
|---|---|---|
| 4,825,201 A | 4/1989 | Watanabe et al. |
| 4,923,285 A | 5/1990 | Ogino et al. |
| 4,996,523 A | 2/1991 | Bell et al. |
| 5,018,838 A | 5/1991 | Barnes et al. |
| 5,144,418 A | 9/1992 | Brown et al. |
| 5,157,387 A | 10/1992 | Momose et al. |
| 5,189,406 A | 2/1993 | Humphries et al. |
| 5,317,334 A | 5/1994 | Sano |
| 5,359,342 A | 10/1994 | Nakai et al. |
| 5,471,225 A | 11/1995 | Parks |
| 5,473,338 A | 12/1995 | Prince et al. |
| 5,497,172 A | 3/1996 | Doherty et al. |
| 5,537,128 A | 7/1996 | Keene et al. |
| 5,548,347 A | 8/1996 | Melnik et al. |
| 5,566,010 A | 10/1996 | Ishii et al. |
| 5,602,559 A | 2/1997 | Kimura |
| 5,619,228 A | 4/1997 | Doherty |
| 5,731,802 A | 3/1998 | Aras et al. |
| 5,751,264 A | 5/1998 | Cavallerano et al. |
| 5,757,353 A * | 5/1998 | Yokota .................. G09G 5/343 345/685 |
| 5,767,832 A | 6/1998 | Koyama et al. |
| 5,818,413 A | 10/1998 | Hayashi et al. |
| 5,905,482 A | 5/1999 | Hughes et al. |
| 5,926,158 A | 7/1999 | Yoneda et al. |
| 5,926,162 A | 7/1999 | Wood et al. |
| 5,936,603 A | 8/1999 | Lippmann et al. |
| 5,936,604 A | 8/1999 | Endou |
| 5,945,972 A | 8/1999 | Okumura et al. |
| 5,959,598 A | 9/1999 | McKnight |
| 5,969,512 A | 10/1999 | Matsuyama |
| 5,969,701 A | 10/1999 | Numao et al. |
| 5,986,640 A | 11/1999 | Baldwin et al. |
| 6,005,558 A | 12/1999 | Hudson et al. |
| 6,034,659 A | 3/2000 | Wald et al. |
| 6,046,716 A | 4/2000 | McKnight |
| 6,067,065 A | 5/2000 | Worley, III et al. |
| 6,121,948 A | 9/2000 | Worley, III et al. |
| 6,127,991 A | 10/2000 | Uehara et al. |
| 6,144,356 A | 11/2000 | Weatherford et al. |
| 6,151,011 A | 11/2000 | Worley, III et al. |
| RE37,056 E | 2/2001 | Wortel et al. |
| 6,195,106 B1 * | 2/2001 | Deering ............... G06T 15/005 345/545 |
| 6,201,521 B1 | 3/2001 | Doherty |
| 6,262,703 B1 | 7/2001 | Perner |
| 6,285,360 B1 | 9/2001 | Li |
| 6,297,788 B1 | 10/2001 | Shigeta et al. |
| 6,317,112 B1 | 11/2001 | Handschy et al. |
| 6,369,782 B2 | 4/2002 | Shigeta |
| 6,407,742 B1 * | 6/2002 | Yeh ........................ G06F 3/14 345/558 |
| 6,424,330 B1 | 7/2002 | Johnson |
| 6,456,267 B1 | 9/2002 | Sato et al. |
| 6,476,792 B2 | 11/2002 | Hattori et al. |
| 6,518,945 B1 | 2/2003 | Pinkham |
| 6,567,138 B1 | 5/2003 | Krusius et al. |
| 6,587,084 B1 | 7/2003 | Alymov et al. |
| 6,603,452 B1 | 8/2003 | Serita |
| 6,621,488 B1 | 9/2003 | Takeuchi et al. |
| 6,690,432 B2 | 2/2004 | Janssen et al. |
| 6,717,561 B1 | 4/2004 | Pfeiffer et al. |
| 6,731,306 B2 | 5/2004 | Booth, Jr. et al. |
| 6,744,415 B2 | 6/2004 | Waterman et al. |
| 6,762,739 B2 | 7/2004 | Bone |
| 6,784,898 B2 | 8/2004 | Lee et al. |
| 6,788,231 B1 | 9/2004 | Hsueh |
| 6,806,871 B1 | 10/2004 | Yasue |
| 6,831,626 B2 | 12/2004 | Nakamura et al. |
| 6,850,216 B2 | 2/2005 | Akimoto et al. |
| 6,862,012 B1 | 3/2005 | Funakoshi et al. |
| 6,924,824 B2 | 8/2005 | Adachi et al. |
| 6,930,667 B1 | 8/2005 | Iijima et al. |
| 6,930,692 B1 | 8/2005 | Coker et al. |
| 7,066,605 B2 | 6/2006 | Dewald et al. |
| 7,067,853 B1 | 6/2006 | Yao |
| 7,088,325 B2 | 8/2006 | Ishii |
| 7,088,329 B2 | 8/2006 | Hudson |
| 7,129,920 B2 | 10/2006 | Chow |
| 7,187,355 B2 | 3/2007 | Tam et al. |
| 7,379,043 B2 | 5/2008 | Worley, III et al. |
| 7,397,980 B2 | 7/2008 | Frisken |
| 7,443,374 B2 | 10/2008 | Hudson |
| 7,468,717 B2 | 12/2008 | Hudson |
| 7,532,190 B2 * | 5/2009 | Lin ....................... G09G 3/3677 345/98 |
| 7,692,671 B2 | 4/2010 | Ng |
| 7,852,307 B2 | 12/2010 | Hudson |
| 7,990,353 B2 | 8/2011 | Chow |
| 8,040,311 B2 | 10/2011 | Hudson et al. |
| 8,111,271 B2 | 2/2012 | Hudson et al. |
| 8,264,507 B2 | 9/2012 | Hudson et al. |
| 8,421,828 B2 | 4/2013 | Hudson et al. |
| 8,643,681 B2 | 2/2014 | Endo et al. |
| 9,047,818 B1 | 6/2015 | Day et al. |
| 9,117,746 B1 | 8/2015 | Clark et al. |
| 9,406,269 B2 | 8/2016 | Lo et al. |
| 9,583,031 B2 | 2/2017 | Hudson et al. |
| 9,824,619 B2 | 11/2017 | Hudson et al. |
| 9,918,053 B2 | 3/2018 | Lo et al. |
| 10,437,402 B1 | 10/2019 | Pan |
| 2001/0013844 A1 | 8/2001 | Shigeta |
| 2002/0024481 A1 | 2/2002 | Kawabe et al. |
| 2002/0041266 A1 | 4/2002 | Koyama et al. |
| 2002/0043610 A1 | 4/2002 | Lee et al. |
| 2002/0135309 A1 | 9/2002 | Okuda |
| 2002/0140662 A1 | 10/2002 | Igarashi |
| 2002/0158825 A1 | 10/2002 | Endo et al. |
| 2003/0058195 A1 | 3/2003 | Adachi et al. |
| 2003/0156102 A1 | 8/2003 | Kimura |
| 2003/0173991 A1 * | 9/2003 | Takafuji ............... G09G 3/3648 324/750.3 |
| 2003/0174117 A1 | 9/2003 | Crossland et al. |
| 2003/0210257 A1 | 11/2003 | Hudson et al. |
| 2004/0032636 A1 | 2/2004 | Willis |
| 2004/0080482 A1 | 4/2004 | Magendanz et al. |
| 2004/0125090 A1 | 7/2004 | Hudson |
| 2004/0174328 A1 | 9/2004 | Hudson |
| 2005/0001794 A1 | 1/2005 | Nakanishi et al. |
| 2005/0001806 A1 | 1/2005 | Ohmura |
| 2005/0052437 A1 | 3/2005 | Hudson |
| 2005/0057466 A1 | 3/2005 | Sala et al. |
| 2005/0062765 A1 | 3/2005 | Hudson |
| 2005/0088462 A1 | 4/2005 | Borel |
| 2005/0184993 A1 * | 8/2005 | Ludwin ................ G09G 3/3611 345/87 |
| 2005/0195894 A1 | 9/2005 | Kim et al. |
| 2005/0200300 A1 | 9/2005 | Yumoto |
| 2005/0264550 A1 * | 12/2005 | Ohshima ............. G09G 3/3233 345/204 |
| 2005/0264586 A1 | 12/2005 | Kim |
| 2006/0012589 A1 | 1/2006 | Hsieh et al. |
| 2006/0012594 A1 | 1/2006 | Worley et al. |
| 2006/0066645 A1 | 3/2006 | Ng |
| 2006/0147146 A1 | 7/2006 | Voigt et al. |
| 2006/0208961 A1 | 9/2006 | Nathan et al. |
| 2006/0242358 A1 * | 10/2006 | Chen .................... G09G 3/3233 711/109 |
| 2006/0284903 A1 | 12/2006 | Ng |
| 2006/0284904 A1 | 12/2006 | Ng |
| 2007/0252855 A1 | 11/2007 | Hudson |
| 2007/0252856 A1 | 11/2007 | Hudson et al. |
| 2008/0007576 A1 | 1/2008 | Ishii et al. |
| 2008/0088613 A1 | 4/2008 | Hudson et al. |
| 2008/0158437 A1 | 7/2008 | Arai et al. |
| 2008/0259019 A1 | 10/2008 | Ng |
| 2009/0027360 A1 | 1/2009 | Kwan et al. |
| 2009/0027364 A1 | 1/2009 | Kwan et al. |
| 2009/0115703 A1 | 5/2009 | Cok |
| 2009/0284671 A1 | 11/2009 | Leister |
| 2009/0303248 A1 | 12/2009 | Ng |
| 2010/0073270 A1 | 3/2010 | Ishii et al. |
| 2010/0214646 A1 | 8/2010 | Sugimoto et al. |
| 2010/0253995 A1 | 10/2010 | Reichelt |

(56) References Cited

U.S. PATENT DOCUMENTS

| | | | |
|---|---|---|---|
| 2010/0295836 | A1 | 11/2010 | Matsumoto et al. |
| 2011/0109299 | A1 | 5/2011 | Chaji et al. |
| 2011/0109670 | A1 | 5/2011 | Sempel et al. |
| 2011/0199405 | A1 | 8/2011 | Dallas |
| 2011/0205100 | A1 | 8/2011 | Bogaerts |
| 2011/0227887 | A1 | 9/2011 | Dallas et al. |
| 2012/0086733 | A1 | 4/2012 | Hudson et al. |
| 2012/0113167 | A1 | 5/2012 | Margerm et al. |
| 2013/0038585 | A1 | 2/2013 | Kasai |
| 2013/0308057 | A1 | 11/2013 | Lu et al. |
| 2014/0085426 | A1 | 3/2014 | Leone et al. |
| 2014/0092105 | A1 | 4/2014 | Guttag |
| 2015/0245038 | A1 | 8/2015 | Clatanoff et al. |
| 2015/0317018 | A1* | 11/2015 | Lin ............ G06F 3/0412 345/173 |
| 2016/0203801 | A1 | 7/2016 | De Groot et al. |
| 2016/0365055 | A9 | 12/2016 | Hudson et al. |
| 2018/0061302 | A1 | 3/2018 | Hu |
| 2019/0347994 | A1 | 11/2019 | Lin et al. |
| 2019/0385501 | A1* | 12/2019 | Xu ............ G11C 19/28 |
| 2020/0098307 | A1* | 3/2020 | Li ............ G09G 3/32 |
| 2021/0201771 | A1 | 7/2021 | Li et al. |

FOREIGN PATENT DOCUMENTS

| | | |
|---|---|---|
| GB | 2327798 A | 3/1999 |
| JP | 7049663 A | 2/1995 |
| JP | 2002-116741 A | 4/2002 |
| TW | I227005 B | 7/1994 |
| TW | 407253 B | 10/2000 |
| TW | 418380 B | 1/2001 |
| TW | 482991 B | 4/2002 |
| TW | 483282 B | 4/2002 |
| TW | 200603192 A | 1/2006 |
| WO | WO 2000070376 A1 | 11/2000 |
| WO | WO 2001052229 A1 | 7/2001 |
| WO | WO 2007127849 A2 | 11/2007 |
| WO | WO 2007127852 A2 | 11/2007 |

OTHER PUBLICATIONS

"2114A 1024 x4 Bit Static RAM", Component Data Catalog, Intel Corp., 1982. Santa Clara, CA, USA.; 7 pages.

Jesacher et al., "Broadband suppression of the zero diffraction order of an SLM using its extended phase modulation range," Optics Express, vol. 22, No. 14, pp. 17590-17599.

Dai et al., "Characteristics of LCoS Phase-only spatial light modulator and its application" Optics Communications vol. 238, pp. 269-276, 2004, especially section 3.2.

Armitage et al., "Introduction to Microdisplays," John Wiley & Sons, 2006, pp. 182-185.

Oton et al., "Multipoint phase calibration for improved compensation of inherent wavefront distortion in parallel aligned liquid crystal on silicon display," Applied Optics, vol. 46, No. 23, pp. 5667-5679, Optical Society of America, 2007.

Amon et al., "PTAT Sensors Based on SJFETs" 10th Mediterranean Electrotechnical Conference, MEIeCon 2000, vol. II pp. 802-805.

Baker, "CMOS Circuit Design, Layout, and Simulation", IEEE Press Series on Microelectronic Systems, pp. 614-616; A John Wiley & Sons, Inc., Publication, 2010.

Ong, "Modem Mos Technology: Processes, Devices, and Design", 1984, p. 207-212, McGraw-Hill Book Company, Arizona, USA.

DJ Potter, et al. "Optical correlation using a phase-only liquid crystal over silicon spatial light modulator" SPIE 1564 Opt. Info. Proc. Sys & Arch. III (1991).

Drabik "Optically Interconnected Parallel Processor Arrays", pp. 121-126, Dec. 1989, Georgia Institute of Technology.

CSE370, Lecture 14 "Flip-Flops" pp. 1-17, "https://studylib.net/doc/18055423/flip-flops".

Colgan, E.G. et al., "On-Chip Metallization Layers for Reflective Light Waves", Journal of Research Development, vol. 42, No. 3/4, May/Jul. 1998; pp. 339-345.

Fuller "Static Random Access Memory—SRAM", pp. 1-39, Nov. 18, 2016, Rochester Institute of technology to Microelectronic Engineering.

Hu, "Complementary MOS (CMOS) Technology", pp. 198-200, Feb. 13, 2009.

Underwood et al., "Evaluation of an nMOS VLSI array for an adaptive liquid-crystal spatial light modulator" IEEE Proc, v.133 Pl.J. No. Feb. 1986, 15 pages.

Kang et al., "Digital Driving of TN-LC for WUXGA LCOS Panel," Digest of Technical Papers, Society for Information Display, 2001, pp. 1264-1267.

Nakamura et al, "Modified drive method for OCB LSD," Proceeding of the International Display Research Conference, 1997, Society for Information Display, Campbell, CA, US, 4 pages.

Pelgrom et al. "Matching Properties of MOS Transistors", Oct. 1989. IEEE Journal of Solid-State Circuits, vol. 23, No. 5, 8 pages.

Rabaey "Digital Integrated Circuits" pp. 138-140, 2016, Saurabh Printers Pvt. Ltd.

Rabaey "The Devices Chapters" Jan. 18, 2002, pp. 121-124.

Robinson, et al, "Polarization Engineering for LCD Projection," pp. 121-123, 2005, John Wiley and Sons, Ltd., Chichester, England.

Anderson et al., "Holographic Data Storage: Science Fiction or Science Fact", Akonia Holographies LLC, presented at Optical Data Storage 2014, 8 pages.

Sloof et al, "An Improved WXGA LCOS Imager for Single Panel Systems" Proceedings of the Asia Symposium on Information Display, 2004, Society for Information Display, Campbell, CA, US; 4 pages.

SMPTE 274M-2005, "1920 x 1080 Image Sample Structure, Digital Representation and Digital Timing Reference Sequences for Multiple Picture Rates," 2005, SMPTE, White Plains, New York, US, 29 pages.

Sony 3D, screen capture from video clip, 2009, authors unknown, 2 pages.

Wang, "Studies of Liquid Crystal Response Time,", University of Central Florida, Doctoral Dissertation, 2005; 128 pages.

Wu, "Discussion #9 MOSFETs", Spring 2008, pp. 1-7, University of California at Berkeley College of Engineering Department of Electrical Engineering and Computer Sciences.

www.westar.com/mdis, Product Description, "Westar's Microdisplay Inspection System" Jan. 2000; 2 pages.

International Search Report and Written Opinion for PCT Application No. PCT/US2022/037046, dated Nov. 17, 2022, 9 pages.

* cited by examiner

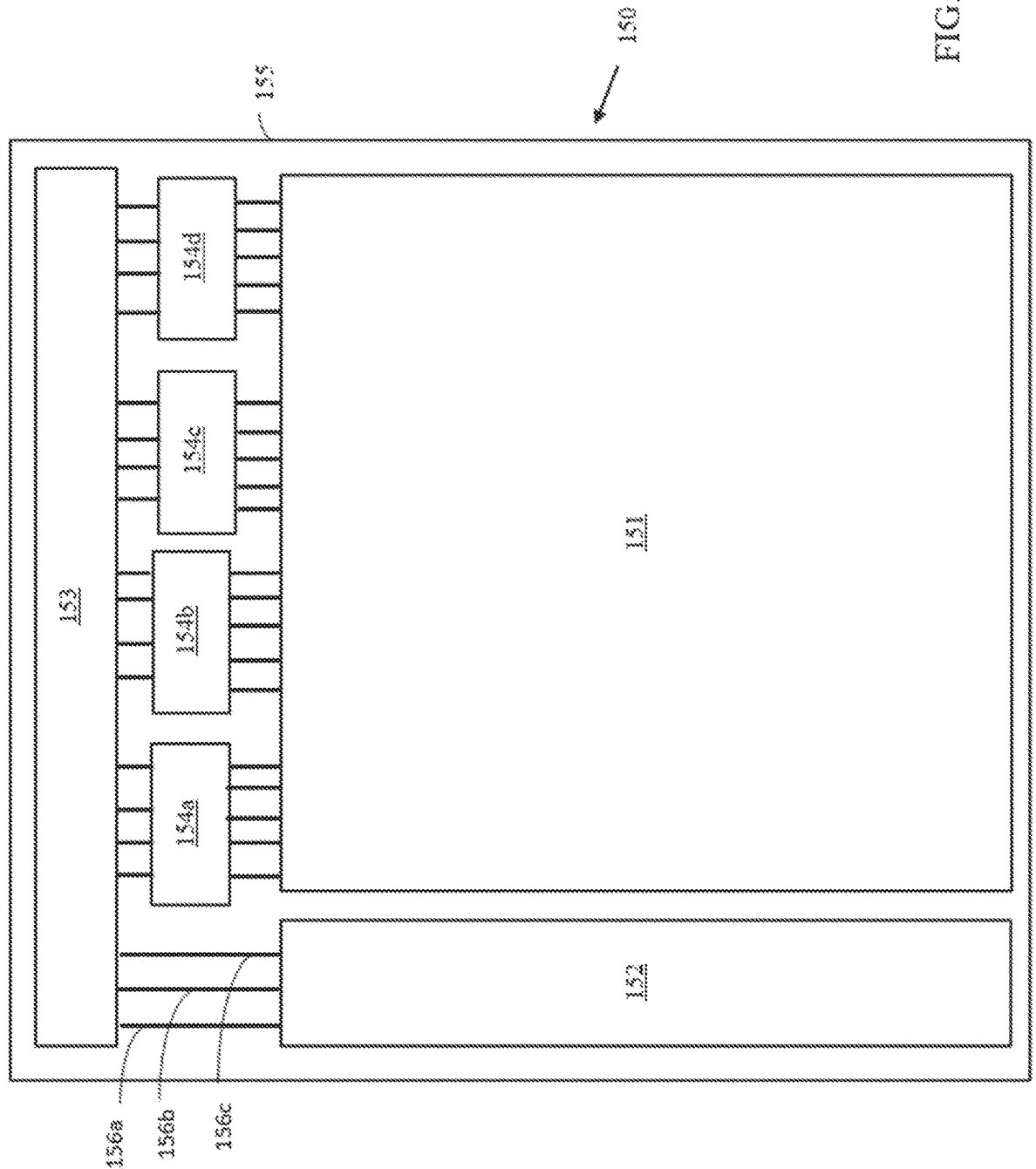

| Shift Registers → | Driver/Controlling Shift Register | | Non-Controlling Shift Registers | |
|---|---|---|---|---|
| Rows ↓ | Row Driver | Shift Reg 0 | Shift Reg 1 | Shift Reg 2 |
| 1 – RW 252a | RD 254a | SR 253a0 | SR 253a1 | SR 253a2 |
| 2 – RW 252b | RD 254b | SR 253b0 | SR 253b1 | SR 253b2 |
| 3 – RW 252c | RD 254c | SR 253c0 | SR 253c1 | SR 253c2 |
| 4 – RW 252d | RD 254d | SR 253d0 | SR 253d1 | SR 253d2 |
| 5 – RW 252e | RD 254e | SR 253e0 | SR 253e1 | SR 253e2 |
| 6 – RW 252f | RD 254f | SR 253f0 | SR 253f1 | SR 253f2 |
| 7 – RW 252g | RD 254g | SR 253g0 | SR 253g1 | SR 253g2 |

Table 1 (Times 1–14):

| Rows↓ Time→ | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 – RW 252a | Wp0 | | | | | | | | | | | | | |
| 2 – RW 252b | | | | Wp0 | Wp1 | | | | | | | | | |
| 3 – RW 252c | | | | | | | Wp0 | Wp1 | | | | | | |
| 4 – RW 252d | | | | | | | | | | Wp0 | Wp1 | Wp2 | | |
| 5 – RW 252e | | | | | Wp1 | | | | | | | | Wp0 | Wp1 |
| 6 – RW 252f | | | | | | | | | | | | | | |
| 7 – RW 252g | | | | | | | | | | | | | | |

Table 2 (Times 15–28):

| Rows↓ Time→ | 15 | 16 | 17 | 18 | 19 | 20 | 21 | 22 | 23 | 24 | 25 | 26 | 27 | 28 |
|---|---|---|---|---|---|---|---|---|---|---|---|---|---|---|
| 1 – RW 252a | | Wp0 | Wp1 | Wp2 | | | | | | | | | | |
| 2 – RW 252b | Wp2 | | | | | | | | | | Wp0 | Wp1 | | Wp0 |
| 3 – RW 252c | | | | | Wp0 | Wp1 | Wp2 | | | | | | | |
| 4 – RW 252d | | | | | | | | Wp0 | Wp1 | Wp2 | | | Wp2 | |
| 5 – RW 252e | | | | | | | | | | | | | | |
| 6 – RW 252f | | | | | | | | | | | | | | |
| 7 – RW 252g | | | | | | | | | | | | | | |

Table 3 (Times 29–42):

| Rows↓ Time→ | 29 | 30 | 31 | 32 | 33 | 34 | 35 | 36 | 37 | 38 | 39 | 40 | 41 | 42 |
|---|---|---|---|---|---|---|---|---|---|---|---|---|---|---|
| 1 – RW 252a | Wp1 | | | | | | | | | | | Wp0 | Wp1 | Wp2 |
| 2 – RW 252b | | Wp2 | Wp0 | Wp1 | Wp2 | | | | | | | | | |
| 3 – RW 252c | | | | | | Wp0 | Wp1 | Wp2 | | | | | | |
| 4 – RW 252d | | | | | | | | | Wp0 | Wp1 | Wp2 | | | |
| 5 – RW 252e | | | | | | | | | | | | | | |
| 6 – RW 252f | | | | | | | | | | | | | | |
| 7 – RW 253g | | | | | | | | | | | | | | |

275

| Rows→<br>Time Interval↓ | 1<br>252a | 2<br>252b | 3<br>252c | 4<br>252d | 5<br>252e | 6<br>252f | 7<br>252g | Remarks |
|---|---|---|---|---|---|---|---|---|
| 1 | 100 | 000 | 000 | 000 | 000 | 000 | 000 | |
| 2 | 010 | 000 | 000 | 000 | 000 | 000 | 000 | No write action |
| 3 | 001 | 000 | 000 | 000 | 000 | 000 | 000 | No write action |
| 4 | 000 | 100 | 000 | 000 | 000 | 000 | 000 | |
| 5 | 100 | 010 | 000 | 000 | 000 | 000 | 000 | |
| 6 | 010 | 001 | 000 | 000 | 000 | 000 | 000 | No write action |
| 7 | 001 | 000 | 100 | 000 | 000 | 000 | 000 | |
| 8 | 000 | 100 | 010 | 000 | 000 | 000 | 000 | |
| 9 | 000 | 010 | 001 | 000 | 000 | 000 | 000 | No write action |
| 10 | 000 | 001 | 000 | 100 | 000 | 000 | 000 | |
| 11 | 000 | 000 | 100 | 010 | 000 | 000 | 000 | |
| 12 | 100 | 000 | 010 | 001 | 000 | 000 | 000 | |
| 13 | 010 | 000 | 001 | 000 | 100 | 000 | 000 | |
| 14 | 001 | 000 | 000 | 100 | 010 | 000 | 000 | |
| 15 | 000 | 100 | 000 | 010 | 001 | 000 | 000 | |
| 16 | 000 | 010 | 000 | 001 | 000 | 100 | 000 | |
| 17 | 000 | 001 | 000 | 000 | 100 | 010 | 000 | |
| 18 | 000 | 000 | 100 | 000 | 010 | 001 | 000 | |
| 19 | 000 | 000 | 010 | 000 | 001 | 000 | 100 | |
| 20 | 000 | 000 | 001 | 000 | 000 | 100 | 010 | |
| 21 | 000 | 000 | 000 | 100 | 000 | 010 | 001 | |
| 22 | 100 | 000 | 000 | 010 | 000 | 001 | 000 | |
| 23 | 010 | 000 | 000 | 001 | 000 | 000 | 100 | |
| 24 | 001 | 000 | 000 | 000 | 100 | 000 | 010 | |
| 25 | 000 | 100 | 000 | 000 | 010 | 000 | 001 | |
| 26 | 100 | 010 | 000 | 000 | 001 | 000 | 000 | |
| 27 | 010 | 001 | 000 | 000 | 000 | 100 | 000 | |
| 28 | 001 | 000 | 100 | 000 | 000 | 010 | 000 | |
| 29 | 000 | 100 | 010 | 000 | 000 | 001 | 000 | |
| 30 | 000 | 010 | 001 | 000 | 000 | 000 | 100 | |
| 31 | 000 | 001 | 000 | 100 | 000 | 000 | 010 | |
| 32 | 000 | 000 | 100 | 010 | 000 | 000 | 001 | |
| 33 | 100 | 000 | 010 | 001 | 000 | 000 | 000 | |
| 34 | 010 | 000 | 001 | 000 | 100 | 000 | 000 | |
| 35 | 001 | 000 | 000 | 100 | 010 | 000 | 000 | |
| 36 | 000 | 100 | 000 | 010 | 001 | 000 | 000 | |
| 37 | 000 | 010 | 000 | 001 | 000 | 100 | 000 | |
| 38 | 000 | 001 | 000 | 000 | 100 | 010 | 000 | |
| 39 | 000 | 000 | 100 | 000 | 010 | 001 | 000 | |
| 40 | 000 | 000 | 010 | 000 | 001 | 000 | 100 | |
| 41 | 000 | 000 | 001 | 000 | 000 | 100 | 010 | |
| 42 | 000 | 000 | 000 | 100 | 000 | 010 | 001 | |

280

|  | Time Interval 6 | | | Time Interval 7 | | | Time Interval 8 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 1 | 0 | 0 | 0 | 1 | 0 | 0 | 0 |
| 2 - 252b | 0 | 0 | 1 | 0 | 0 | 0 | 1 | 0 | 0 |
| 3 - 252c | 0 | 0 | 0 | 1 | 0 | 0 | 0 | 1 | 0 |
| 4 - 252d | 0 | 0 | 0 | 0 | 0 | 0 | 0 | 0 | 0 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|  | Time Interval 9 | | | Time Interval 10 | | | Time Interval 11 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 1 | 0 | 0 | 0 | 1 | 0 | 0 | 0 |
| 3 - 252c | 0 | 0 | 1 | 0 | 0 | 0 | 1 | 0 | 0 |
| 4 - 252d | 0 | 0 | 0 | 1 | 0 | 0 | 0 | 1 | 0 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|  | Time Interval 12 | | | Time Interval 13 | | | Time Interval 14 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 1 | 0 | 0 | 0 | 1 | 0 | 0 | 0 | 1 |
| 2 - 252b | 0 | 0 | 0 | 0 | 0 | 0 | 0 | 0 | 0 |
| 3 - 252c | 0 | 1 | 0 | 0 | 0 | 1 | 0 | 0 | 0 |
| 4 - 252d | 0 | 0 | 1 | 0 | 0 | 0 | 1 | 0 | 0 |
| 5 - 252e | 0 | 0 | 0 | 1 | 0 | 0 | 0 | 1 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|       | Time Interval 15 |        |        | Time Interval 16 |        |        | Time Interval 17 |        |        |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 1 | 0 | 0 | 0 | 1 | 0 | 0 | 0 | 1 |
| 3 - 252c | 0 | 0 | 0 | 0 | 0 | 0 | 0 | 0 | 0 |
| 4 - 252d | 0 | 1 | 0 | 0 | 0 | 1 | 0 | 0 | 0 |
| 5 - 252e | 0 | 0 | 1 | 0 | 0 | 0 | 1 | 0 | 0 |
| 6 - 252f | 0 | 0 | 0 | 1 | 0 | 0 | 0 | 1 | 0 |
| 7 - 252g | 0 | 0 | 0 | 0 | 0 | 0 | 0 | 0 | 0 |

|       | Time Interval 18 |        |        | Time Interval 19 |        |        | Time Interval 20 |        |        |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 0 | 0 | 0 | 0 | 0 | 0 | 0 | 0 |
| 3 - 252c | 1 | 0 | 0 | 0 | 1 | 0 | 0 | 0 | 1 |
| 4 - 252d | 0 | 0 | 0 | 0 | 0 | 0 | 0 | 0 | 0 |
| 5 - 252e | 0 | 1 | 0 | 0 | 0 | 1 | 0 | 0 | 0 |
| 6 - 252f | 0 | 0 | 1 | 0 | 0 | 0 | 1 | 0 | 0 |
| 7 - 252g | 0 | 0 | 0 | 1 | 0 | 0 | 0 | 1 | 0 |

|       | Time Interval 21 |        |        | Time Interval 22 |        |        | Time Interval 23 |        |        |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 0 | 0 | 1 | 0 | 0 | 0 | 1 | 0 |
| 2 - 252b | 0 | 0 | 0 | 0 | 0 | 0 | 0 | 0 | 0 |
| 3 - 252c | 0 | 0 | 0 | 0 | 0 | 0 | 0 | 0 | 0 |
| 4 - 252d | 1 | 0 | 0 | 0 | 1 | 0 | 0 | 0 | 1 |
| 5 - 252e | 0 | 0 | 0 | 0 | 0 | 0 | 0 | 0 | 0 |
| 6 - 252f | 0 | 1 | 0 | 0 | 0 | 1 | 0 | 0 | 0 |
| 7 - 252g | 0 | 0 | 1 | 0 | 0 | 0 | 1 | 0 | 0 |

|  | Time Interval 24 | | | Time Interval 25 | | | Time Interval 26 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 1 | 0 | 0 | 0 | 1 | 0 | 0 |
| 2 - 252b | 0 | 0 | 0 | 1 | 0 | 0 | 0 | 1 | 0 |
| 3 - 252c | 0 | 0 | 0 | 0 | 0 | 0 | 0 | 0 | 0 |
| 4 - 252d | 0 | 0 | 0 | 0 | 0 | 0 | 0 | 0 | 0 |
| 5 - 252e | 1 | 0 | 0 | 0 | 1 | 0 | 0 | 0 | 1 |
| 6 - 252f | 0 | 0 | 0 | 0 | 0 | 0 | 0 | 0 | 0 |
| 7 - 252g | 0 | 1 | 0 | 0 | 0 | 1 | 0 | 0 | 0 |

|  | Time Interval 27 | | | Time Interval 28 | | | Time Interval 29 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 1 | 0 | 0 | 0 | 1 | 0 | 0 | 0 |
| 2 - 252b | 0 | 0 | 1 | 0 | 0 | 0 | 1 | 0 | 0 |
| 3 - 252c | 0 | 0 | 0 | 1 | 0 | 0 | 0 | 1 | 0 |
| 4 - 252d | 0 | 0 | 0 | 0 | 0 | 0 | 0 | 0 | 0 |
| 5 - 252e | 0 | 0 | 0 | 0 | 0 | 0 | 0 | 0 | 0 |
| 6 - 252f | 1 | 0 | 0 | 0 | 1 | 0 | 0 | 0 | 1 |
| 7 - 252g | 0 | 0 | 0 | 0 | 0 | 0 | 1 | 0 | 0 |

|  | Time Interval 30 | | | Time Interval 31 | | | Time Interval 32 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 1 | 0 | 0 | 1 | 0 | 0 | 0 | 0 |
| 3 - 252c | 0 | 0 | 1 | 0 | 0 | 1 | 1 | 0 | 0 |
| 4 - 252d | 0 | 0 | 0 | 0 | 0 | 0 | 0 | 1 | 0 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 1 | 0 | 0 | 1 | 0 | 0 | 0 | 0 | 1 |

| Row | Time Interval a | | | Time Interval b | | | Time Interval c | | |
| --- | --- | --- | --- | --- | --- | --- | --- | --- | --- |
| | SReg 0 | SReg 1 | SReg 2 | SReg 0 | SReg 1 | SReg 2 | SReg 0 | SReg 1 | SReg 2 |
| 1 – 252a | 0 | 1 | 0 | 0 | 0 | 1 | 0 | 0 | 0 |
| 2 – 252b | 0 | 0 | 0 | 0 | 0 | 0 | 1 | 0 | 0 |
| 3 – 252c | 0 | 0 | 0 | 0 | 0 | 0 | 0 | 0 | 0 |
| 4 – 252d | 0 | 1 | 0 | 0 | 0 | 1 | 0 | 0 | 0 |
| 5 – 252e | 0 | 0 | 0 | 0 | 0 | 0 | 1 | 0 | 0 |
| 6 – 252f | 0 | 0 | 0 | 0 | 0 | 0 | 0 | 0 | 0 |
| 7 – 252g | 0 | 0 | 0 | 0 | 0 | 0 | 0 | 0 | 0 |

| Row | Time Interval d | | | Time Interval e | | | Time Interval f | | |
| --- | --- | --- | --- | --- | --- | --- | --- | --- | --- |
| | SReg 0 | SReg 1 | SReg 2 | SReg 0 | SReg 1 | SReg 2 | SReg 0 | SReg 1 | SReg 2 |
| 1 – 252a | 0 | 0 | 0 | 0 | 0 | 0 | 0 | 0 | 0 |
| 2 – 252b | 0 | 1 | 0 | 0 | 0 | 1 | 0 | 0 | 0 |
| 3 – 252c | 0 | 0 | 0 | 0 | 0 | 0 | 1 | 0 | 0 |
| 4 – 252d | 0 | 0 | 0 | 0 | 0 | 1 | 0 | 0 | 0 |
| 5 – 252e | 0 | 1 | 0 | 0 | 0 | 0 | 0 | 0 | 0 |
| 6 – 252f | 0 | 0 | 0 | 0 | 0 | 0 | 1 | 0 | 0 |
| 7 – 252g | 0 | 0 | 0 | 0 | 0 | 0 | 0 | 0 | 0 |

| Rows↓ Time→ | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 1 – RW 252a | Wp0 | | | | Wp1 | | | | | | | Wp2 | | |
| 2 – RW 252b | | | | Wp0 | | | | | | | Wp1 | | | |
| 3 – RW 252c | | | | | | | Wp0 | Wp1 | | | | | | |
| 4 – RW 252d | | | | | | | | | | Wp0 | | | | |
| 5 – RW 252e | | | | | | | | | | | | | Wp0 | Wp1 |
| 6 – RW 252f | | | | | | | | | | | | | | |
| 7 – RW 252g | | | | | | | | | | | | | | |

| Rows↓ Time→ | 15 | 16 | 17 | 18 | 19 | 20 | 21 | 22 | 23 | 24 | 25 | 26 | 27 | 28 |
|---|---|---|---|---|---|---|---|---|---|---|---|---|---|---|
| 1 – RW 252a | | | | | | | | | | | | | | Wp3 |
| 2 – RW 252b | Wp2 | | | | | | | Wp3 | | | | | | |
| 3 – RW 252c | | | Wp1 | | | | Wp2 | | | | Wp3 | | | |
| 4 – RW 252d | | | | Wp2 | | | | | | Wp2 | | | | |
| 5 – RW 252e | | | | | | Wp1 | | | Wp1 | | | | Wp2 | |
| 6 – RW 252f | | Wp0 | | | Wp0 | | | | | | | | | |
| 7 – RW 252g | | | | | | | | | | | | | | |

| Rows↓ Time→ | 29 | 30 | 31 | 32 | 33 | 34 | 35 | 36 | 37 | 38 | 39 | 40 | 41 | 42 |
|---|---|---|---|---|---|---|---|---|---|---|---|---|---|---|
| 1 – RW 252a | Wp4 | | | | | | | | | | | | | Wp5 |
| 2 – RW 252b | | | | Wp4 | | | | | | | Wp5 | | Wp4 | |
| 3 – RW 252c | | | Wp3 | | | | Wp4 | | | Wp4 | Wp5 | | | |
| 4 – RW 252d | | | | | | Wp3 | | | | Wp4 | | | | |
| 5 – RW 252e | | | | | | | | Wp5 | Wp3 | | | | | |
| 6 – RW 252f | | | | | Wp0 | | | | | | | Wp3 | | |
| 7 – RW 252g | | Wp2 | | | | | | | | | | | | |

| Rows → Time Intervals ↓ | 1 252a | 2 252b | 3 252c | 4 252d | 5 252e | 6 252f | 7 252g | Remarks |
|---|---|---|---|---|---|---|---|---|
| 1 | 100 | 000 | 000 | 000 | 000 | 000 | 000 | |
| 2 | 010 | 000 | 000 | 000 | 000 | 000 | 000 | No write action |
| 3 | 001 | 000 | 000 | 000 | 000 | 000 | 000 | No write action |
| 4 | 000 | 100 | 000 | 000 | 000 | 000 | 000 | |
| 5 | 100 | 010 | 000 | 000 | 000 | 000 | 000 | |
| 6 | 010 | 001 | 000 | 000 | 000 | 000 | 000 | No write action |
| 7 | 001 | 000 | 100 | 000 | 000 | 000 | 000 | |
| 8 | 000 | 100 | 010 | 000 | 000 | 000 | 000 | |
| 9 | 000 | 010 | 001 | 000 | 000 | 000 | 000 | No write action |
| 10 | 000 | 001 | 000 | 100 | 000 | 000 | 000 | |
| 11 | 000 | 000 | 100 | 010 | 000 | 000 | 000 | |
| 12 | 100 | 000 | 010 | 001 | 000 | 000 | 000 | |
| 13 | 010 | 000 | 001 | 000 | 100 | 000 | 000 | |
| 14 | 001 | 000 | 000 | 100 | 010 | 000 | 000 | |
| 15 | 000 | 100 | 000 | 010 | 001 | 000 | 000 | |
| 16 | 000 | 010 | 000 | 001 | 000 | 100 | 000 | |
| 17 | 000 | 001 | 000 | 000 | 100 | 010 | 000 | |
| 18 | 000 | 000 | 100 | 000 | 010 | 001 | 000 | |
| 19 | 000 | 000 | 010 | 000 | 001 | 000 | 100 | |
| 20 | 000 | 000 | 001 | 000 | 000 | 100 | 010 | |
| 21 | 000 | 000 | 000 | 100 | 000 | 010 | 001 | |
| 22 | 100 | 000 | 000 | 010 | 000 | 001 | 000 | |
| 23 | 010 | 000 | 000 | 001 | 000 | 000 | 100 | |
| 24 | 001 | 000 | 000 | 000 | 100 | 000 | 010 | |
| 25 | 000 | 100 | 000 | 000 | 010 | 000 | 001 | |
| 26 | 000 | 010 | 000 | 000 | 001 | 000 | 000 | No write action |
| 27 | 000 | 001 | 000 | 000 | 000 | 100 | 000 | |
| 28 | 000 | 000 | 100 | 000 | 000 | 010 | 000 | |
| 29 | 100 | 000 | 010 | 000 | 000 | 001 | 000 | |
| 30 | 010 | 000 | 001 | 000 | 000 | 000 | 100 | |
| 31 | 001 | 000 | 000 | 100 | 000 | 000 | 010 | |
| 32 | 000 | 100 | 000 | 010 | 000 | 000 | 001 | |
| 33 | 000 | 010 | 000 | 001 | 000 | 000 | 000 | No write action |
| 34 | 000 | 001 | 000 | 000 | 100 | 000 | 000 | |
| 35 | 000 | 000 | 100 | 000 | 010 | 000 | 000 | |
| 36 | 100 | 000 | 010 | 000 | 001 | 000 | 000 | |
| 37 | 010 | 000 | 001 | 000 | 000 | 100 | 000 | |
| 38 | 001 | 000 | 000 | 100 | 000 | 010 | 000 | |
| 39 | 000 | 100 | 000 | 010 | 000 | 001 | 000 | |
| 40 | 000 | 010 | 000 | 001 | 000 | 000 | 100 | |
| 41 | 000 | 001 | 000 | 000 | 100 | 000 | 010 | |
| 42 | 000 | 000 | 100 | 000 | 010 | 000 | 001 | |

|  | Time Interval 19 | | | Time Interval 20 | | | Time Interval 21 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 0 | 0 | 0 | 0 | 0 | 0 | 0 | 0 |
| 3 - 252c | 0 | 1 | 0 | 0 | 0 | 1 | 0 | 0 | 0 |
| 4 - 252d | 0 | 0 | 0 | 0 | 0 | 0 | 1 | 0 | 0 |
| 5 - 252e | 0 | 0 | 1 | 0 | 0 | 0 | 0 | 0 | 0 |
| 6 - 252f | 0 | 0 | 0 | 1 | 0 | 0 | 0 | 1 | 0 |
| 7 - 252g | 1 | 0 | 0 | 0 | 1 | 0 | 0 | 0 | 1 |

|  | Time Interval 22 | | | Time Interval 23 | | | Time Interval 24 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 1 | 0 | 0 | 0 | 1 | 0 | 0 | 0 | 1 |
| 2 - 252b | 0 | 0 | 0 | 0 | 0 | 0 | 0 | 0 | 0 |
| 3 - 252c | 0 | 0 | 0 | 0 | 0 | 0 | 0 | 0 | 0 |
| 4 - 252d | 0 | 1 | 0 | 0 | 0 | 1 | 0 | 0 | 0 |
| 5 - 252e | 0 | 0 | 0 | 0 | 0 | 0 | 1 | 0 | 0 |
| 6 - 252f | 0 | 0 | 1 | 0 | 0 | 0 | 0 | 0 | 0 |
| 7 - 252g | 0 | 0 | 0 | 1 | 0 | 0 | 0 | 1 | 0 |

|  | Time Interval 25 | | | Time Interval 26 | | | Time Interval 27 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 1 | 0 | 0 | 0 | 1 | 0 | 0 | 0 | 1 |
| 3 - 252c | 0 | 0 | 0 | 0 | 0 | 0 | 0 | 0 | 0 |
| 4 - 252d | 0 | 0 | 0 | 0 | 0 | 0 | 0 | 0 | 0 |
| 5 - 252e | 0 | 1 | 0 | 0 | 0 | 1 | 0 | 0 | 0 |
| 6 - 252f | 0 | 0 | 0 | 0 | 0 | 0 | 1 | 0 | 0 |
| 7 - 252g | 0 | 0 | 1 | 0 | 0 | 0 | 0 | 0 | 0 |

FIG. 4C

| Row | Time Interval 28 | | | Time Interval 29 | | | Time Interval 30 | | |
|---|---|---|---|---|---|---|---|---|---|
| | SReg 0 | SReg 1 | SReg 2 | SReg 0 | SReg 1 | SReg 2 | SReg 0 | SReg 1 | SReg 2 |
| 1 - 252a | 0 | 0 | 0 | 1 | 0 | 0 | 0 | 1 | 0 |
| 2 - 252b | 0 | 0 | 0 | 0 | 0 | 0 | 0 | 0 | 0 |
| 3 - 252c | 1 | 0 | 0 | 0 | 1 | 0 | 0 | 0 | 1 |
| 4 - 252d | 0 | 0 | 0 | 0 | 0 | 0 | 0 | 0 | 0 |
| 5 - 252e | 0 | 0 | 0 | 0 | 0 | 0 | 0 | 0 | 0 |
| 6 - 252f | 0 | 1 | 0 | 0 | 0 | 1 | 0 | 0 | 0 |
| 7 - 252g | 0 | 0 | 0 | 0 | 0 | 0 | 1 | 0 | 0 |

| Row | Time Interval 31 | | | Time Interval 32 | | | Time Interval 33 | | |
|---|---|---|---|---|---|---|---|---|---|
| | SReg 0 | SReg 1 | SReg 2 | SReg 0 | SReg 1 | SReg 2 | SReg 0 | SReg 1 | SReg 2 |
| 1 - 252a | 0 | 0 | 1 | 0 | 0 | 0 | 0 | 0 | 0 |
| 2 - 252b | 0 | 0 | 0 | 1 | 0 | 0 | 0 | 1 | 0 |
| 3 - 252c | 0 | 0 | 0 | 0 | 0 | 0 | 0 | 0 | 0 |
| 4 - 252d | 1 | 0 | 0 | 0 | 1 | 0 | 0 | 0 | 1 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 0 | 1 | 0 | 0 | 0 | 1 | 0 | 0 | 0 |

| Row | Time Interval 34 | | | Time Interval 35 | | | Time Interval 36 | | |
|---|---|---|---|---|---|---|---|---|---|
| | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 1 | 0 | 0 |
| 2 - 252b | 0 | 0 | 1 | 0 | 0 | 0 | 0 | 0 | 0 |
| 3 - 252c | 0 | 0 | 0 | 1 | 0 | 0 | 0 | 1 | 0 |
| 4 - 252d | 0 | 0 | 0 | 0 | 0 | 0 | 0 | 0 | 0 |
| 5 - 252e | 1 | 0 | 0 | 0 | 1 | 0 | 0 | 0 | 1 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|  | Time Interval 37 | | | Time Interval 38 | | | Time Interval 39 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 1 | 0 | 0 | 0 | 1 | 0 | 0 | 0 |
| 2 - 252b | 0 | 0 | 0 | 0 | 0 | 0 | 1 | 0 | 0 |
| 3 - 252c | 0 | 0 | 1 | 0 | 0 | 0 | 0 | 0 | 0 |
| 4 - 252d | 0 | 0 | 0 | 1 | 0 | 0 | 0 | 1 | 0 |
| 5 - 252e | 0 | 0 | 0 | 0 | 0 | 0 | 0 | 0 | 0 |
| 6 - 252f | 1 | 0 | 0 | 0 | 1 | 0 | 0 | 0 | 1 |
| 7 - 252g | 0 | 0 | 0 | 0 | 0 | 0 | 0 | 0 | 0 |

|  | Time Interval 40 | | | Time Interval 41 | | | Time Interval 42 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 1 | 0 | 0 | 0 | 1 | 0 | 0 | 0 |
| 3 - 252c | 0 | 0 | 0 | 0 | 0 | 0 | 1 | 0 | 0 |
| 4 - 252d | 0 | 0 | 1 | 0 | 0 | 0 | 0 | 0 | 0 |
| 5 - 252e | 0 | 0 | 0 | 1 | 0 | 0 | 0 | 1 | 0 |
| 6 - 252f | 0 | 0 | 0 | 0 | 0 | 0 | 0 | 0 | 0 |
| 7 - 252g | 1 | 0 | 0 | 0 | 1 | 0 | 0 | 0 | 1 |

|  | Time Interval 1 | | | Time Interval 2 | | | Time Interval 3 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 1 | 0 | 0 | 0 | 1 | 0 | 0 | 0 | 1 |
| 2 - 252b | 0 | 0 | 0 | 0 | 0 | 0 | 0 | 0 | 0 |
| 3 - 252c | 0 | 0 | 0 | 0 | 0 | 0 | 0 | 0 | 0 |
| 4 - 252d | 0 | 0 | 0 | 0 | 0 | 0 | 0 | 0 | 0 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|  | Time Interval 4 | | | Time Interval 5 | | | Time Interval 6 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 1 | 0 | 0 | 0 | 1 | 0 |
| 2 - 252b | 1 | 0 | 0 | 0 | 1 | 0 | 0 | 0 | 1 |
| 3 - 252c | 0 | 0 | 0 | 0 | 0 | 0 | 1 | 0 | 0 |
| 4 - 252d | 0 | 0 | 0 | 0 | 0 | 0 | 0 | 1 | 0 |
| 5 - 252e | 0 | 0 | 0 | 0 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|  | Time Interval 7 | | | Time Interval 8 | | | Time Interval 9 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 1 | 0 | 0 | 0 | 0 | 0 | 0 |
| 2 - 252b | 0 | 0 | 0 | 1 | 0 | 0 | 0 | 1 | 0 |
| 3 - 252c | 1 | 0 | 0 | 0 | 1 | 0 | 0 | 0 | 1 |
| 4 - 252d | 0 | 0 | 0 | 0 | 0 | 0 | 0 | 0 | 0 |
| 5 - 252e | 0 | 0 | 0 | 1 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

325

|       | Time Interval 10 | | | Time Interval 11 | | | Time Interval 12 | | |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 1 | 0 | 0 |
| 2 - 252b | 0 | 0 | 1 | 0 | 0 | 0 | 0 | 0 | 0 |
| 3 - 252c | 0 | 0 | 0 | 1 | 0 | 0 | 0 | 1 | 0 |
| 4 - 252d | 1 | 0 | 0 | 0 | 1 | 0 | 0 | 0 | 1 |
| 5 - 252e | 0 | 0 | 1 | 0 | 0 | 0 | 0 | 0 | 0 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|       | Time Interval 13 | | | Time Interval 14 | | | Time Interval 15 | | |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 1 | 0 | 0 | 0 | 1 | 0 | 0 | 0 |
| 2 - 252b | 0 | 0 | 0 | 0 | 0 | 0 | 1 | 0 | 0 |
| 3 - 252c | 0 | 0 | 1 | 0 | 0 | 0 | 0 | 0 | 0 |
| 4 - 252d | 0 | 0 | 0 | 1 | 0 | 0 | 0 | 1 | 0 |
| 5 - 252e | 1 | 0 | 0 | 0 | 1 | 0 | 0 | 0 | 1 |
| 6 - 252f | 0 | 0 | 0 | 0 | 0 | 0 | 0 | 0 | 0 |
| 7 - 252g | 0 | 0 | 0 | 0 | 0 | 0 | 0 | 0 | 0 |

|       | Time Interval 16 | | | Time Interval 17 | | | Time Interval 18 | | |
|-------|------|------|------|------|------|------|------|------|------|
| Row   | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 1 | 0 | 0 | 0 | 1 | 0 | 0 | 0 |
| 3 - 252c | 0 | 0 | 0 | 0 | 0 | 0 | 1 | 0 | 0 |
| 4 - 252d | 0 | 0 | 1 | 0 | 0 | 0 | 0 | 0 | 0 |
| 5 - 252e | 0 | 0 | 0 | 1 | 0 | 0 | 0 | 1 | 0 |
| 6 - 252f | 1 | 0 | 0 | 0 | 1 | 0 | 0 | 0 | 1 |
| 7 - 252g | 0 | 0 | 0 | 0 | 0 | 0 | 0 | 0 | 0 |

|  | Time Interval 19 | | | Time Interval 20 | | | Time Interval 21 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 0 | 0 | 0 | 0 | 0 | 0 |
| 2 - 252b | 0 | 0 | 0 | 0 | 0 | 0 | 0 | 0 | 0 |
| 3 - 252c | 0 | 1 | 0 | 0 | 0 | 1 | 0 | 0 | 0 |
| 4 - 252d | 0 | 0 | 0 | 0 | 0 | 0 | 1 | 0 | 0 |
| 5 - 252e | 0 | 0 | 1 | 0 | 0 | 0 | 0 | 0 | 0 |
| 6 - 252f | 0 | 0 | 0 | 1 | 0 | 0 | 0 | 1 | 0 |
| 7 - 252g | 1 | 0 | 0 | 0 | 1 | 0 | 0 | 0 | 1 |

|  | Time Interval 22 | | | Time Interval 23 | | | Time Interval 24 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 1 | 0 | 0 | 0 | 1 | 0 | 0 | 0 | 1 |
| 2 - 252b | 0 | 0 | 0 | 0 | 0 | 0 | 0 | 0 | 0 |
| 3 - 252c | 0 | 0 | 0 | 0 | 0 | 0 | 0 | 0 | 0 |
| 4 - 252d | 0 | 1 | 0 | 0 | 0 | 1 | 0 | 0 | 0 |
| 5 - 252e | 0 | 0 | 0 | 0 | 0 | 0 | 1 | 0 | 0 |
| 6 - 252f | 0 | 0 | 1 | 0 | 0 | 0 | 0 | 0 | 0 |
| 7 - 252g | 0 | 0 | 0 | 1 | 0 | 0 | 0 | 1 | 0 |

|  | Time Interval 25 | | | Time Interval 26 | | | Time Interval 27 | | |
|---|---|---|---|---|---|---|---|---|---|
| Row | SReg 0 | SReg 1 | SReg 2 | SReg 0 | SReg 1 | SReg 2 | SReg 0 | SReg 1 | SReg 2 |
| 1 - 252a | 0 | 0 | 0 | 1 | 0 | 0 | 0 | 1 | 0 |
| 2 - 252b | 1 | 0 | 0 | 0 | 1 | 0 | 0 | 0 | 1 |
| 3 - 252c | 0 | 0 | 0 | 0 | 0 | 0 | 0 | 0 | 0 |
| 4 - 252d | 0 | 0 | 0 | 0 | 0 | 0 | 0 | 0 | 0 |
| 5 - 252e | 0 | 1 | 0 | 0 | 0 | 1 | 0 | 0 | 0 |
| 6 - 252f | 0 | 0 | 0 | 0 | 0 | 0 | 1 | 0 | 0 |
| 7 - 252g | 0 | 0 | 1 | 0 | 0 | 0 | 0 | 0 | 0 |

BACKPLANE AND METHOD FOR PULSE WIDTH MODULATION

RELATED APPLICATIONS

The present application claims the benefit of U.S. Provisional Patent Application No. 63/221,536, filed on Jul. 14, 2021, which is incorporated by reference in its entirety for all purposes.

FIELD OF THE INVENTION

The present invention relates to a backplane that is operative to drive an array of pixel drive circuits.

BACKGROUND

Backplanes for display devices have been manufactured using various processes for a number of years. The market for such devices is competitive with other mature companies participating with competing products. The cost of fabricating display devices in single crystal silicon is relatively high.

SUMMARY

In one embodiment, a backplane configured to drive a display includes an array of pixel drive circuits, organized as a plurality of rows and a plurality of columns, each of the pixel drive circuits including a memory circuit operable to receive and store a display value, a plurality of word lines, wherein each word line connects with the pixel drive circuits of a corresponding one of the rows, a plurality of bit lines, wherein each bit line is operable to present the display value to all of the pixel drive circuits along a corresponding one of the columns, and at least one shift register addressing assembly. The shift register addressing assembly includes: a plurality of controlling shift registers, each one of the controlling shift registers having an output operable to control a different one of the plurality of word lines; a plurality of non-controlling shift registers serially connected with the plurality of controlling shift registers to form a shift register chain, wherein a group of at least one of the plurality of non-controlling shift registers is logically positioned between sequential ones of the plurality of controlling shift registers; and a sequence input of a first one of the plurality of controlling shift registers for receiving a shift register data sequence that in operation controls selection of the plurality of word lines.

In another embodiment, a method of operating a two-dimensional display of display elements, includes: providing a backplane that drives the two-dimensional display, the backplane including: a two-dimensional array of pixel drive circuits, organized as a plurality of rows and a plurality of columns, wherein each of the pixel drive circuits: includes a corresponding memory circuit that is operable to receive and store a display value, and in operation, can produce an output that drives a display element of the two-dimensional display, according to the display value stored in the corresponding memory circuit; a plurality of word lines, wherein each word line connects with the pixel drive circuits of a corresponding one of the rows; a plurality of bit lines, wherein each bit line is operable to present the display value to all of the pixel drive circuits along a corresponding one of the columns; and a shift register addressing assembly that includes: a plurality of controlling shift registers, each one of the controlling shift registers being operable to control a different word line of the plurality of word lines according to a data value in the controlling shift register, wherein, in operation, the memory circuits of the pixel drive circuits corresponding to at least part of one of the rows are selectively enabled, by action of one of the word lines, to receive ones of the display values presented by the respective bit lines of the memory circuits; and a plurality of non-controlling shift registers that are not operable to control any of the word lines, wherein the controlling shift registers and the non-controlling shift registers are serially connected in a shift register chain with groups of one or more of the non-controlling shift registers logically disposed within the shift register chain, between successive ones of the controlling shift registers, such that the data values propagate through both the controlling and non-controlling shift registers in response to successive cycles of a clock signal. The method further includes: inputting, at each cycle of the clock signal, one data value from a shift register data sequence to a first controlling shift register of the plurality of controlling shift registers, wherein the shift register data sequence is arranged to cause a maximum of one of the controlling shift registers to operate its respective word line during any one period of the clock signal; and providing successive cycles of the clock signal to the controlling shift registers and non-controlling shift registers to propagate the data values through the shift register chain.

BRIEF DESCRIPTION OF THE DRAWINGS

FIG. 1B presents a schematic block diagram of a backplane with a shift register row addressing assembly, in accord with one or more embodiments.

FIG. 3B presents an explanatory table identifying the types of components that includes the modified shift register addressing assembly of FIG. 3A, in accord with one or more embodiments.

FIG. 3C presents a plot of write pointers that may be implemented by the modified shift register addressing assembly of FIG. 3A, in accord with one or more embodiments.

FIGS. 3E, 3F and 3G present a table of the data states of individual shift registers for selected time intervals from FIG. 3C, in accord with one or more embodiments.

FIG. 3H presents a disadvantageous shift register data sequence.

FIG. 4A presents a plot of a write pointer sequence wherein the span of rows of the write pointer sequence exceeds the number of rows on the backplane of FIG. 3A, in accord with one or more embodiments.

FIG. 4B presents a table of shift register data states versus sequential time intervals generated by the write pointer sequence of FIG. 4A, in accord with one or more embodiments.

FIGS. 4C, 4D and 4E present a table of the data states of individual shift registers for selected time intervals from FIG. 4A, in accord with one or more embodiments.

FIGS. 5A, 5B and 5C present a table of the data state of individual shift registers for the first twenty-seven time intervals from FIG. 3D, in accord with one or more embodiments.

DETAILED DESCRIPTION

Figure 1A:
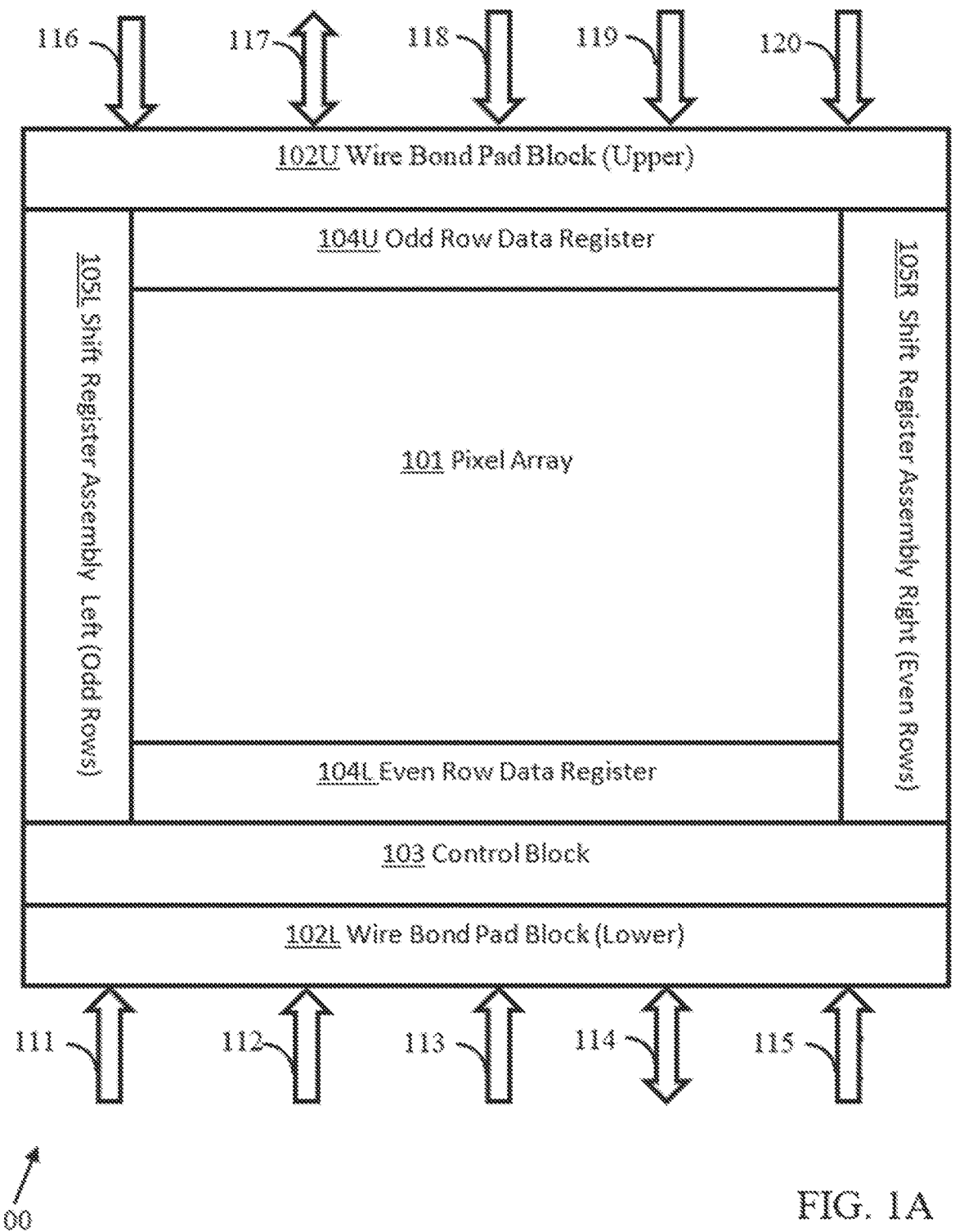
FIG. 1A presents a schematic block diagram of a backplane suitable to drive an array of pixel drive circuits, in accord with one or more embodiments.

The present disclosure relates to the design and use of a shift register assembly operative to control the writing of data to rows of an array of pixel drive circuits during consecutive time periods. Advantageously, the writing of data during consecutive time periods may occur on non-adjacent rows and according to a predetermined pattern that repeats down the display, and optionally with a fixed number of rows offset between each instance of the pattern.

The cost of fabricating display devices in certain technologies can be high enough to limit their use to a range of applications where the high cost is offset by performance factors. Also, the use of single crystal silicon may impose a size limitation for a display device, based on the limits of one or more reticle(s) used in the chosen manufacturing process. It is desirable, therefore, to find ways to expand the range of manufacturing technologies for display applications to other, lower cost materials.

One such material is low temperature polycrystalline silicon, hereafter LTPS. Another is indium gallium zinc oxide (IGZO.) Still other technologies are known, such as amorphous silicon. Each may be used as part of a backplane with varying degrees of charge mobility and therefore varying degrees of operating bandwidth. Such materials are typically used to form thin-film transistors (TFT) on a suitable glass or other type substrate. The backplane described herein may be implemented in single crystal silicon, although other implementations using row decoders could be easily implemented.

One feature of some backplanes disclosed herein, using any of the above technologies, is that row write actions are triggered by use of a shift register data sequence that is input to a first shift register of a plurality of serially connected shift registers (e.g., a shift register chain) and clocked through the chain of shift registers such that one different shift register of the chain triggers one row in a fixed sequence. For example, the incoming values may be a high state, e.g., operative to place the word line of a row into a state such that cells in the row receive image data, while other values in the shift register data sequence are placed in a low state that is not operative to place the word lines of those rows in a state such that cells in the row receive image data. This results in the display being written top to bottom, or bottom to top, as the data values move through the shift register chain. Image data written to the pixels of a row may include an analog voltage that varies among individual pixels or may include a relatively fixed voltage that drives each pixel to the same level. In the latter case, the display may be pulse width modulated to achieve intermediate values along a gray scale. Pulse-width-modulation (PWM) is a method of driving a section of a display (e.g., a pixel drive circuit) to create gray scale. In one type of PWM, varying gray scale levels are represented by multi-bit words (e.g., a binary number). These multi-bit words are converted into a series of pulses. The time averaged RMS voltage corresponds to a specific voltage necessary to maintain a desired gray scale level. Reference to a word line being placed in a high state indicates the word line is placing associated pixel drive circuits in a state to receive image data, and reference to a word line being placed in a low state indicates the word line is not placing associated pixel drive circuits in a state to receive image data.

Although this approach is functional, it places some bandwidth limitations on the displayed images because, once written, a row of the display cannot be changed until all other rows below it are written, then the shift register on-state values begin again at the top, and come down to that row. This limits the minimum duration of the least significant bit to the time required to write the entire array.

One constraint for many displays is size and power. In known systems using PWM, a higher image write frequency improves the modulation efficiency, since the data for each pixel can be updated more frequently. However, the time that each bit of data is displayed also needs to be controlled and thus higher frequency systems do not always solve the control problem. Furthermore, higher speed driving circuits are inevitably more expensive and draw more power from the system, factors that are undesirable in the design of such circuits. Another way to improve the modulation efficiency is to lower the framerate of the system. However, a lower frame rate may significantly aggravate flicker issues in the display, another undesirable effect. It is therefore desirable to increase the image write frequency in a display without increasing the frequency of the driving circuit and without increasing the system power consumption.

Disclosed herein are a system and a method for overcoming this limitation, by using a row decoder assembly to select rows to be written such that individual rows written consecutively in time need not be spatially adjacent, and which may in fact be operated in a predetermined arrangement that forms a pattern. In most embodiments, the pattern is selected so that the spacing between rows in a pattern are roughly proportional to the duration of a bit plane of modulation initiated on a row by the passing of a first write pointer, that is subsequently written again by the passing of other write pointers of the pattern, as they propagate down the rows during subsequent time intervals.

Note that in a shift register based backplane, the sequence of word lines being written may move from the last row to be written, back to the first row to be written originally, e.g., a non-adjacent row. This is sometimes a consequence of the physical layout of the rows.

One aspect of the present disclosure is a modified shift register assembly that is driven by a shift register data sequence that defines a row addressing pattern across time that result in non-contiguous row write actions at various spacings, wherein the durations of a series of bit planes are roughly determined by spacings between the rows. Bit planes may be determined through planarization of an input signal (e.g., a video signal and/or image stream). See U.S. Pat. No. 6,144,356, titled "System and Method for Data Planarization," incorporated herein by reference in its entirety for all purposes.

Advantageously, through the use of planarization, and PWM using the modified shift register addressing assembly with multiple write pointers, lower voltages and/or lower clock speeds may be used on the backplane and display, simplifying design, resulting in improved display quality, and using less power as compared to a prior art backplane that does not include the shift register addressing assembly.

Applicant's previous patents relate to bitplane architecture that is similar to the bitplane architecture referred to above. These patents include U.S. patent application Ser. No. 10/435,427, now U.S. Pat. No. 8,421,828, its continuation U.S. patent application Ser. No. 13/790,120, now U.S. Pat. No. 9,583,031, and the continuation of U.S. Pat. No. 9,583,031, U.S. patent application Ser. No. 15/408,869, now U.S. Pat. No. 9,824,619, the contents whereof are incorporated herein by reference for all purposes. FIGS. 7A, 7B, 8A and 8B, and the associated specification text in all these patents are particularly instructive. These patents are collectively referred to herein as "the MegaMod patents." One goal of the present embodiments is to implement a modulation scheme similar to the modulation schemes of the MegaMod patents in a backplane using the previously described technologies, such as LTPS, without requiring the development of a row decoder circuit assembly able to execute a row select scheme in those technologies.

A feature of the modulation scheme discussed in the preceding paragraph is the use of row addressing circuitry that enables writing data to non-contiguous rows. The rows to be written respond to a pattern of row write actions that may be repeatedly applied to the rows of an array, with an offset between successive applications of the same pattern. The offset is normally one or two rows, depending on the specifics of the backplane, as explained below, but other offsets are contemplated and can be implemented by one skilled in the art, upon reading and understanding the present disclosure.

As the pattern of row write actions progresses through the rows of the display, a row with image data written to it in response to a first write pointer may then have different image data written to it in response to a second write pointer. Write pointer sequences that include twenty or more write pointers have been devised. In the present application, simple examples are given as aids to understanding, but these examples should be understood as not limiting the range of patterns and/or values that are possible in embodiments.

The use of pulse width modulation to modulate a LTPS backplane or similar device affords the opportunity to use such a backplane with an emissive device, such as organic light emitting diode display (OLEDs) or small conventional light-emitting diodes (LEDs), sometimes referred to as microLEDs or μLEDs. Use of pulse width modulation at a constant voltage reduces color shifting in the emitted light that may occur when these devices are modulated with varying voltages.

Both circuits that may require DC balancing of a liquid crystal layer (e.g., liquid crystal display circuits) and circuits that do not require DC balancing (e.g., micro light emitting diode (μLED) circuits) are contemplated. Collectively these are referred to as display elements. Generally, in these display applications, writing image data to a row of pixel drive circuits takes place in response to a word line of that row being pulled high, enabling memory circuits of the pixel drive circuits of that row to receive image data that is served over bit lines.

These and other objectives and advantages of the present embodiments, along with modifications and equivalents to those embodiments, will become clear to those of ordinary skill in the art after reading and understanding this detailed description, accompanied by the various figures.

FIG. 1A presents a block diagram of data transfer sections and certain external interfaces of an example backplane 100. Backplane 100 includes a pixel drive circuit array 101, a left shift register addressing assembly 105L for odd rows, a right shift register addressing assembly 105R for even rows, a column data register array 104L (lower) for even rows, a column data register array 104U (upper) for odd rows, a control block 103, and wire bond pad blocks 102L (lower) and 102U (upper). It should be understood that the designations of shift register addressing assemblies as "right" or "left," and of column data register arrays and wire bond pad blocks as "upper" and "lower" are for clarity in reference to FIG. 1A, and do not imply any limitation on spatial layout or physical organization in an actual backplane. Wire bond pad block 102L provides contact with a flexible printed circuit assembly (FPCA) or other suitable connecting device(s), to receive data and control signals over input(s) from a display controller circuit, and may include one or more clock lines 111, one or more op code lines 112, one or more signal lines 113, one or more temperature signal lines 114, and/or parallel data signal lines 115. The selected interfaces for upper wire bond pad block 102U include circuit voltages V_H 116 and V_L 117, temperature sensor digital interface 118, rail voltages $V_{DD}$ and $V_{SS}$ 119, and return voltage 120. The function and polarity of these voltages depend on a number of factors that vary across different types of pixel drive circuits and/or process technologies, as evident to one skilled in the art.

Physical layout of backplane components may vary from those depicted and remain within the scope of the present disclosure. For example, only one shift register addressing assembly may be required, or all external connections may be along a single side of the backplane. In some embodiments, only one row data register is used to provide data to the pixel drive circuits of both even and odd rows.

Wire bond pad block 102L receives image data and control signals and connects these signals with control block 103. Control block 103 receives and routes image data to column data register array 104L (lower) or column data register array 104U (upper). In one embodiment, the value of Op Code line(s) 112 may determine which of the two shift register addressing assemblies 105L or 105R is active.

Shift register addressing assembly 105L left (e.g., odd rows) and shift register addressing assembly 105R right (e.g., even rows) are configured to operate word lines. In operation, a data value in a shift register causes a row driver to put the respective word line into a condition such that image data for the corresponding row may be transferred from column data register array 104L and/or from column data register array 104U, to the memory circuits of the pixel cells of that row of pixel drive circuit array 101. In one embodiment only one column data register array is present on the backplane.

Clock line(s) 111 may include a plurality of lines carrying a variety of different clock signals. For example, the shift register addressing assemblies may receive a clock signal HCLK from clock line(s) 111 in order to advance the shift register data values. Also, the column data registers may receive a clock signal CLK from a controller through clock line(s) 111 as part of a process that transfers image data to the column data registers.

Signal line(s) 113 may include a variety of signal lines, including a reset function for shift register addressing assemblies 105L and 105R and a separate reset function for column data register arrays 104U and 104L. Signal line(s) 113 may also include a separate line that supplies data to one or both of shift register addressing assemblies 105L, 105R, and another that keeps the shift register addressing assemblies synchronized with image data to be loaded onto row(s) that are enabled, by their respective word line(s), shift register addressing assemblies 105L, 105R. An enable signal, to turn on components such as column data register arrays 104U, 104L that may be otherwise placed in a standby state, is contemplated.

FIG. 1B presents a block diagram of a backplane assembly 150 with additional detail beyond that shown in FIG. 1A. Backplane assembly 150 includes a substrate 155 (e.g., formed of glass or an alternative material), an array of pixel drive circuits 151, a shift register addressing assembly 152, column drivers 154a, 154b, 154c and 154d, and a controller 153.

In certain embodiments, array of pixel drive circuits 151 and shift register addressing assembly 152 are formed in thin film transistors (TFTs) on substrate 155 using techniques that are known in the art. Other components, such as controller 153 and column drivers 154a-154d may be formed of small integrated circuits fabricated in single crystal silicon (or other material systems) that are surface mounted to substrate 155.

Figure 1C:
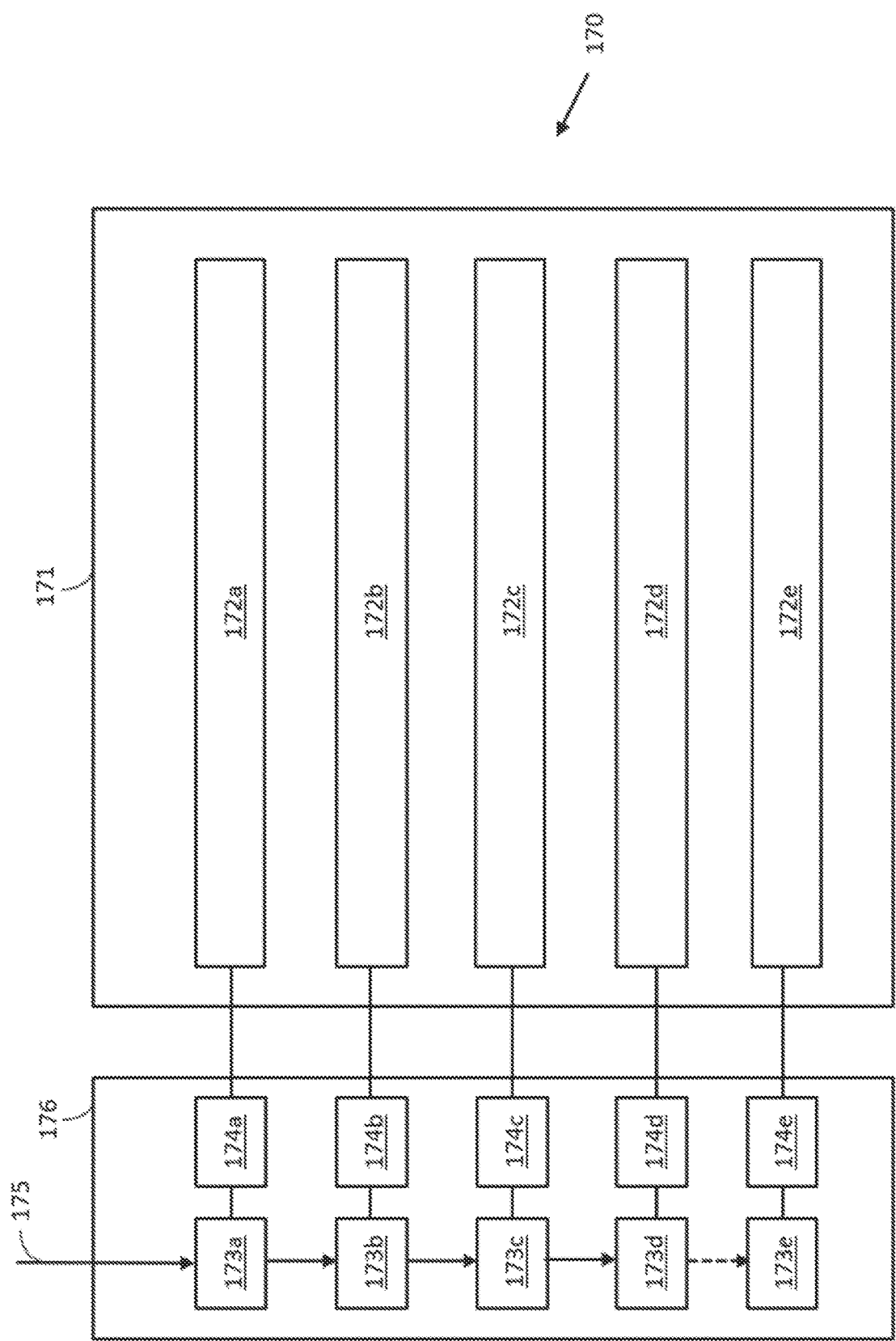
FIG. 1C presents a schematic block diagram of a shift register addressing assembly with its connections to the rows of a backplane.

Controller 153 delivers various signals and data to shift register addressing assembly 152 and column drivers 154 of backplane assembly 150. For example, controller 153 may deliver the HCLK over line(s) 156a to shift register addressing assembly 152, and/or may deliver a shift register data sequence (e.g., R Data, or Register Data) over line(s) 156b, and/or a RST (Reset) signal over line(s) 156c to shift register addressing assembly 152. Advantageously, the shift register data sequence is a single bit and therefore uses less space and less power than a prior art row decoder assembly that requires multiple input bits. In some embodiments, HCLK advances the data within shift register addressing assembly 152, R Data provides a logical 1 or 0 to shift register addressing assembly 152, and RST may reset shift register addressing assembly 152. Controller 153 may direct at least CLK, Data (Pixel Data) and RST (Reset) over lines to column drivers 154a-154d. Column drivers 154a-154d, in turn, deliver the pixel data to the pixels of the row pulled high over the column drive lines (not indicated). FIG. 1C presents a simplified block diagram of a prior art backplane 170 that includes a shift register and shift register assembly 176, and a row assembly 171. Row assembly 171 includes rows 172a-172e. Each of row driver 174a-174e connects with a respective one of rows 172a-172e. Shift register/row driver assembly 176 includes a set of shift registers 173a-173e coupled with row drivers 174a-174e, where there is one shift register 173 and row driver 174 for each row 172. Each shift register 173 drives one row driver 174 when high. Each shift register 173 and associated row driver 174 are formed in a single circuit. In this prior art backplane 170 (using shift registers to determine which row is activated to receive data from the column registers), the number of shift registers is the same as the number of rows. Data from column registers (not shown) is delivered over bit lines to all rows 172. Either one bit line or two bit lines may be required for each column, depending on the type of memory circuits utilized in rows 172.

A shift register data sequence is received over input 175. The prior art shift register data sequence is normally a high data state, also referred to as a 1 state or a 1 value for a first clock cycle of a HCLK clock signal at the start of the refresh cycle followed by low states for each remaining clock of the refresh cycle. As an HCLK clock signal operates, the high data state propagates through shift register assembly 176, pulling the word lines for each successive row of 172a-172e high, as previously described.

In the present disclosure, a high shift register data point enables a respective row of pixel drive circuits to receive image data asserted on data lines or bit lines, and places that image data into their respective memory circuits. Normally, a signal on the gate of one or more pass transistors of each memory circuit is used to allow this to happen. If the pass transistor is an n-channel transistor, as is the case for the most common SRAM circuits, then the word line signal for the selected row is a high signal. If the pass transistor is a p-channel transistor, then the word line signal for the selected row is a lower voltage than the voltage on non-selected rows. In both cases, the signal that enables the pass transistor to pass image data is defined herein as a high state or high data state, regardless of actual voltage.

The clock for shift registers 173 is, in most cases, implemented as two non-overlapping clock signals that run substantially out of phase with respect to one another. The duty cycle for either of the two non-overlapping clock signals may be set appropriately in order to allow for clock skew due to manufacturing tolerances of the process in use.

In order for shift register assembly 176 to function correctly as a component of a display system, a shift register data sequence propagating through shift registers 173 only places one shift register in a high data state at a time, because data on the bit lines is intended for only one row. Thus, if the shift register data sequence is the same length as the number of shift registers 173 in shift register assembly 176 that are configured to control respective row drivers 174, then only one is active at a time. If the shift register data sequence is longer than the number of shift registers 173 in shift register assembly 176, then more than one shift register 173 may be placed in a high data state, provided that only one of the two shift register data sequence points that are high, are so far apart in the sequence that only one is placed on a shift register 173 that is operative to control one of the row drivers 174, to enable the writing of data to that row. At a minimum, this distance is at least the total number of shift registers 173 that control row drivers 174.

In some cases, the row controlled by a word line may be less than a full row of pixel drive circuits. The remaining pixel drive circuits may be controlled by one or more additional word lines operated independently from the other word lines.

Figure 1D:
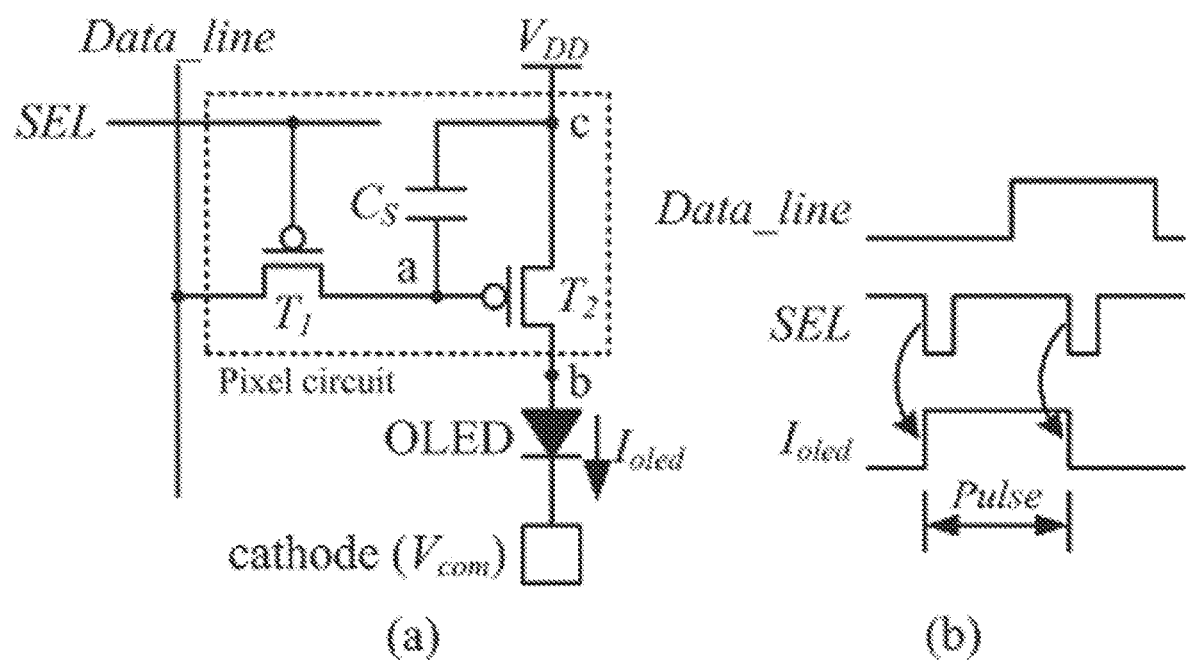
FIG. 1D presents a schematic and timing diagram for a pulse width modulated OLED pixel drive circuit.

FIG. 1D presents a schematic drawing of one example pixel drive circuit 180(a), and a timing chart 180(b), for a pulse width modulated current pixel of array of pixel drive circuits 151 of FIG. 1B. FIG. 1D is taken from *A digitally driven pixel circuit with current compensation for AMOLED microdisplays*, Yuan Ji, et al, Journal of the Society for Information Display, Vol 22/9, pp. 465-472, San Jose, Calif. 2015. However, the following description is adapted from that reference.

Pixel drive circuit 180(a) includes two p-channel transistors $T_1$ and $T_2$, and a capacitor CS, and is thus referred to herein as a 2T1C pixel drive circuit. Timing chart 180(b)

depicts a pulse train sequence able to cause pixel drive circuit 180(*a*) to emit current for a limited period of time. The following description is taken directly from the text of the referenced paper cited immediately above. In 2T1C pixel drive circuit 180(*a*), $T_1$ and $T_2$ both work as switches. When a word line, here called SEL, is low, $T_1$ is open, so $T_2$ is turned on or off depending on the voltage level of a node a, driven by a bit line, here called Data_line. When word line SEL is high, $T_2$ is switched off, so the voltage level present at node a is held in CS. An OLED pixel current $I_{OLED}$ thus constrained to one of two states: on or off. $I_{OLED}$ may be modulated by controlling SEL and/or Data_line by varying either the pulse width or density.

The signal provided to a word line such as SEL may be adjusted depending on the specifics of the pixel drive circuit used. In a classic 6 transistor SRAM cell (not shown) the gate transistors are two n-channel FETs, which must be brought high to cause the FETs to conduct a data state present on bit lines onto the SRAM cell. In the example of pixel drive circuit 180(*a*), word line SEL operates on a p-channel transistor, which must have its gate brought low to conduct the data from Data_line to node a of the circuit. Both possibilities are contemplated for the present application, and the use of terminology should be interpreted that way.

Figure 2A:
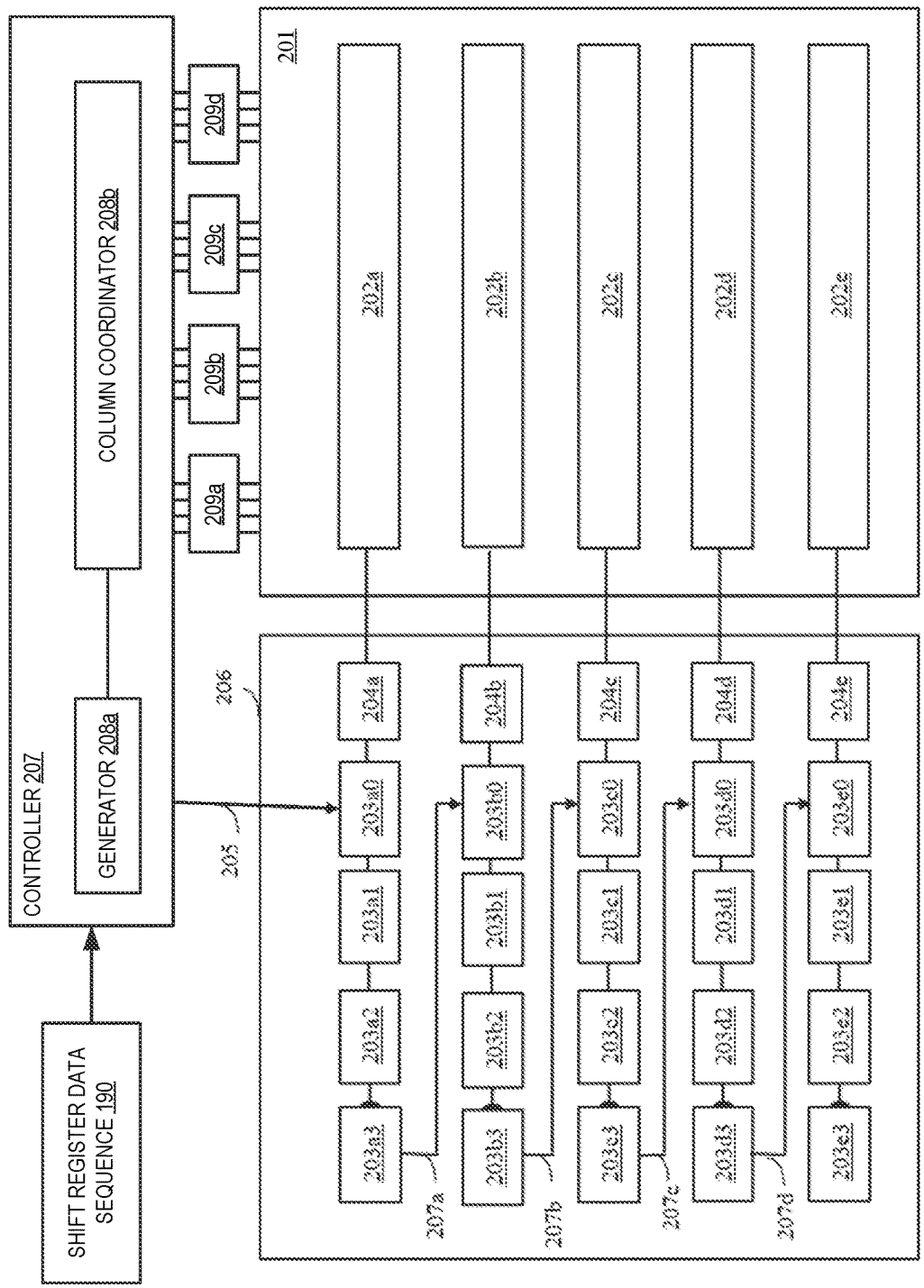
FIG. 2A presents a schematic block diagram of a modified shift register addressing assembly that includes both controlling shift registers and non-controlling shift registers, in accord with one or more embodiments.
Figure 2B:
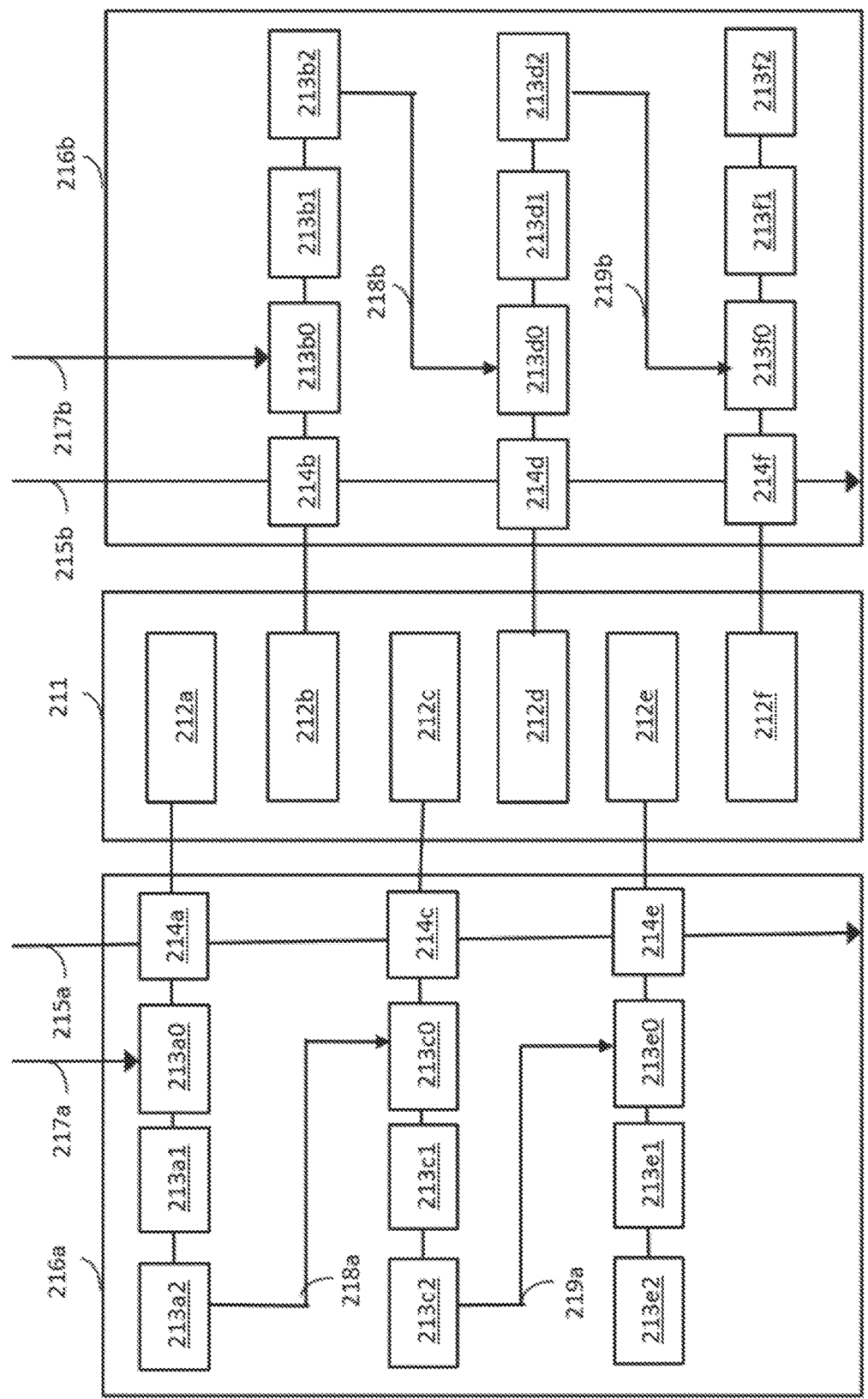
FIG. 2B presents a schematic block diagram of a row addressing implementation wherein a first modified shift register addresses the odd rows of a backplane, and a second modified shift register addresses the even rows of a backplane, in accord with one or more embodiments.
Figure 2C:
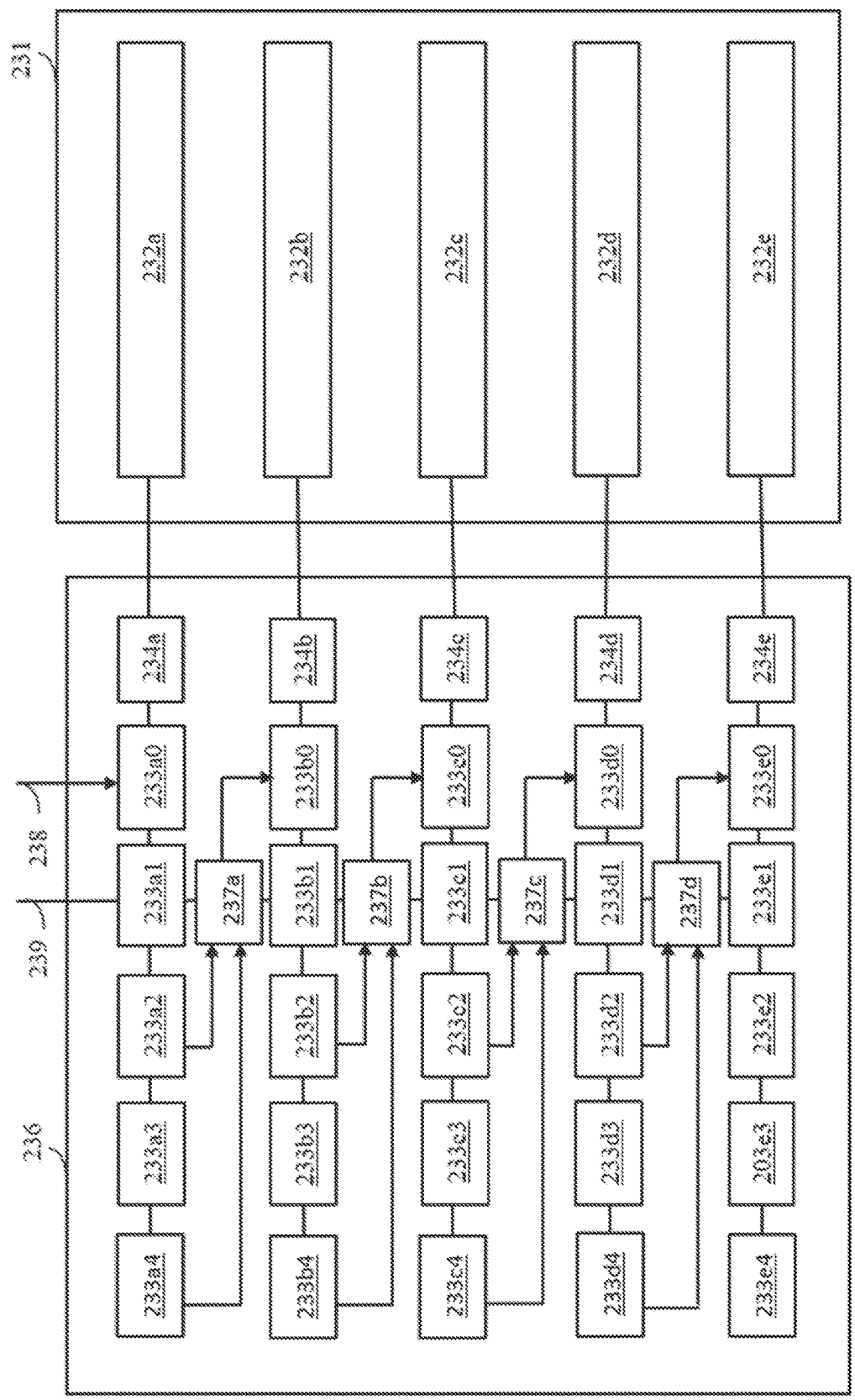
FIG. 2C presents a schematic block diagram of a modified shift register addressing assembly wherein selecting means may select between a first number of non-controlling shift registers and a second number of non-controlling shift registers, in accord with one or more embodiments.

FIGS. 2A-2C present hardware configurations of modified shift registers, in accord with one or more embodiments. FIGS. 3A-3E present details of how the shift registers may be operated, of example sequences and constraints, and illustrate how a shift register data sequence may be determined.

FIG. 2A is a simplified block diagram of a backplane 200 having a modified shift register addressing assembly 206 that includes both controlling shift registers and non-controlling shift registers, in accord with one or more embodiments. Backplane 200 includes a shift register addressing assembly 206 and row assembly 201. Row assembly 201 includes rows 202*a*-202*e*. Shift register addressing assembly 206 includes row drivers 204*a*-204*e*, wherein each row driver 204*a*-204*e* drives one respective row 202*a*-202*e* of row assembly 201. Unlike the prior art illustrated in FIG. 1C, shift register addressing assembly 206 includes multiple shift registers 203 for each row 202. Data for shift register addressing assembly 206 is received via an input 205 from a sequence generator 208*a* of a controller 207. Each row driver 204*a*-204*e* is connected to a respective shift register 203*a*0-203*e*0, which are the only shift registers that may place a row in a state to receive data. Row drivers 204*a*-204*e* drives the word line for the respective rows 202*a*-202*e* to a state operative to enable the memory circuits of pixel drive circuits of that row to receive new data, as discussed above in connection with FIG. 1D. Shift registers 203*a*0-203*e*0 may be referred to as controlling shift registers. Other shift registers 203*a*1-203*a*3, 203*b*1-203*b*3, 203*c*1-203*c*3, 203*d*1-203*d*3, and 203*e*1-203*e*3 are present in the sequence of shift registers of a shift register addressing assembly 206, but do not connect with a row driver and/or form a word line, and therefore do not place any row in a state to receive data over column drivers. Thus, shift registers 203*a*1-203*a*3, 203*b*1-203*b*3, 203*c*1-203*c*3, 203*d*1-203*d*3, and 203*e*1-203*e*3 may be referred to as non-controlling shift registers. In certain embodiments, sequence generator 208*a* loads a predefined shift register data sequence 190 (e.g., from a file, a serial storage device, and so on). In other embodiments, controller 207 includes programmable memory that is configured with shift register data sequence 190. Sequence generator 208*a* cooperates with a column coordinator 208*b* within controller 207 to coordinate column data presented via column drivers 209*a*-209*d* such that rows 202*a*-202*e* receive the correct data when in a state to receive the data. For example, sequence generator 208*a* may send a row identifier determined by shift register data sequence 190 and the current position within the sequence, to column coordinator 208*b* such that column coordinator 208*b* places the data for the identified row on column drivers 209*a*-209*d*. In certain embodiments, shift register data sequence 190 and activation of word lines by row drivers 204*a*-204*e* is deterministic, whereby input image data is arranged and fed to column drivers 209*a*-209*d* in the appropriate order, thereby requiring no additional coordination. That is the shift register data sequence and therefore the row activation order and timing are known in advance and the image data is assembled into the correct, predetermined order based on this knowledge. Another consideration is the form in which the image data is found. In a generic analog system, a voltage is stored on the column driver that is loaded onto the memory of the pixel drive circuit. For a TFT, this is a single thin film transistor for example. In a digital system, the image data for each pixel is stored as a series of bit planes. The order in which the bit planes are presented to a view may have a dramatic effect on the perceived quality of the image. Accordingly, the predetermined order of image data is also based on bit planes and the write pointers defined within the shift register data sequence as described herein. Advantageously, the non-controlling shift registers space data propagating within shift register addressing assembly 206 to allow greater control in the spacing and timing in control of row drivers 204*a*-204*e*.

Only one controlling shift register is associated with each row 202, and the number of non-controlling shift registers following the controlling shift registers associated with a first row is typically identical to the number of non-controlling shift registers following the shift registers of all other rows. In one possible exception, in one or more embodiments, the number of non-controlling shift registers following the last controlling shift register (e.g., shift register 203*e*0 in FIG. 2A) is zero (0). This is because after shift register 203*e*0 operates, with no further rows to operate, there would be no need for further shift registers to provide data spacing within shift register addressing assembly 206. However, to improve manufacturing yield (by maintaining printing consistency of a photolithographic process, for example), it may be beneficial to include non-controlling shift registers after the last controlling shift register. Further, it may be beneficial to include non-controlling shift registers after the last controlling shift register to ensure that the shift register chain retains its existing propagation delay all the way to the last controlling shift register, even though the trailing non-controlling shift registers are not logically needed.

FIG. 2B presents a second simplified block diagram of a backplane 210 illustrating a row addressing implementation wherein a first modified shift register addresses the odd rows of a backplane, and a second modified shift register addresses the even rows of a backplane, in accord with one or more embodiments. Backplane 210 includes a row assembly 211, a left shift register addressing assembly 216*a* operative to control writing of data to odd numbered rows 212*a*, 212*c* and 212*e* of row assembly 211, and a right shift register addressing assembly 216*b* operative to control writing of data to even numbered rows 212*b*, 212*d* and 212*f* of row assembly 211. One or more signals from a controller (not shown) may be applied to one or both of input 215*a* and input 215*b*, to determine when left shift register addressing assembly 216a and right shift register addressing assembly 216b is active. A clock signal (not shown) to advance data within shift register addressing assemblies 216a and 216b, may operate in conjunction with the select signal(s). It should be understood that the designations of shift register addressing assemblies 216a and 216b as "right" or "left" are only for clarity in reference to FIG. 2B, and do not imply any limitation on spatial layout or physical organization in an actual backplane, beyond the specifics stated herein.

In one embodiment, both left shift register addressing assembly 216a and right shift register addressing assembly 216b are active at the same time. In such an instance, separate row data registers for those rows controlled by left shift register addressing assembly 216a, and for those rows controlled by right shift register addressing assembly 216b, may be in simultaneous use (for example, see odd column data register array 104U and even column data register array 104L, illustrated within backplane 100 of FIG. 1A).

In backplane 210, rows 212a, 212c and 212e represent odd numbered rows, and rows 212b, 212d and 212f represent even numbered rows. Left shift register addressing assembly 216a includes row drivers 214a, 214c and 214e that generate word lines of rows 212a, 212c and 212e respectively, in response to inputs received from controlling shift registers 213a0, 213c0 and 213e0 respectively. Non-controlling shift register 213a1 receives a data value from controlling shift register 213a0 on a first clock cycle, and non-controlling shift register 214a2 receives the same data value from non-controlling shift register 213a1 on a second clock cycle. On a third clock cycle, the data value from non-controlling shift register 213a2 propagates to controlling shift register 213c0 over link 218a. On fourth and fifth clock cycles the state of controlling shift register 213c0 propagates to non-controlling shift register 213c1, and then onto non-controlling shift register 213c2, in turn. On a sixth clock cycle the state of non-controlling shift register 213c2 propagates to controlling shift register 213e0. On subsequent clock cycles the data value from controlling shift register 213e0 may propagate to non-controlling shift registers 213e1 and 213e2, in turn.

In an embodiment wherein controlling shift register 213e0 is the last controlling shift register in left shift register addressing assembly 216a, the following non-controlling shift registers 213e1 and 213e2 may be omitted. When this is the case, the controller (not shown) for the backplane may account for the timing requirement to initiate the start of the next instance of the shift register data sequence when the output of the shift register chain is fed back to the controller (e.g., when output from the end of the shift register chain is used to coordinate timing of subsequent shift register input sequences). In embodiments where there is no feedback from the end of the shift register chain to the controller or the front of the shift register chain, the controller actions need not differ depending on whether or not the last non-controlling shift registers are present.

The operation of right shift register addressing assembly 216b is substantially similar to that of left shift register addressing assembly 216a. Right shift register addressing assembly 216b includes row drivers 214b, 214d and 214f operative to operate the word lines of rows 212b, 212d and 212f respectively, in response to inputs received from controlling shift registers 213b0, 213d0 and 213f0 respectively. Non-controlling shift register 213b1 receives its data values from controlling shift register 213b0 on a first clock cycle, and non-controlling shift register 213b2 receives the same data value from non-controlling shift register 213b1 on a second clock cycle. On a third clock cycle, the data value from non-controlling shift register 213b2 propagates to controlling shift register 213d0 over link 218b. On fourth and fifth clock cycles, the data value of controlling shift register propagates to non-controlling shift registers 213d1 and 213d2 respectively. On a sixth clock cycle the data value of shift register 213d2 propagates to controlling shift register 213f0. On subsequent clock cycles the data value of controlling shift register 213f0 may propagate to non-controlling shift register 213f1 and 213f2 in turn.

In the embodiment previously described, wherein controlling shift register 213f0 is the last controlling shift register in right shift register addressing assembly 216b, the non-controlling shift registers 213f1 and 213f2 following controlling shift register 213f0 may be omitted.

Note that in the illustrated embodiment, left shift register addressing assembly 216a only controls the word lines for rows 214a, 214c and 214e and right shift register addressing assembly 216b only controls the word lines for rows 214b, 214d and 214f These row distributions may optionally be hard wired to ensure that neither of the two shift register addressing assemblies controls word lines of two immediately adjacent rows. This arrangement may be implemented as a hardware design decision and does not mean the non-adjacent rows are at arbitrary positions.

FIG. 2C presents a third simplified block diagram of an example backplane 230 where the number of non-controlling shift registers following each controlling shift register in the sequence of shift register addressing assembly 236 is switchable between four non-controlling shift registers and two non-controlling shift registers. The actual number of shift registers in the two states is arbitrary and may be greater or lesser than the numbers presented in the example of FIG. 2C. The number of states of alternative numbers of non-controlling shift registers may be greater than two, following the principles disclosed herein.

Backplane 230 includes a row assembly 231 and a shift register addressing assembly 236. Row assembly 231 includes five rows 232a, 232b, 232c, 232d and 232e, each controlled by a word line generated by row drivers 234a, 234b, 234c, 234d and 234e of shift register addressing assembly 236, respectively. Row drivers 234a, 234b, 234c, 234d and 234e are operated by controlling shift registers 233a0, 233b0, 233c0, 233d0, and 233e0 of shift register addressing assembly 236, respectively. A shift register data sequence may be inserted, via input 238, into controlling shift register 233a0.

Shift register addressing assembly 236 includes a group of non-controlling shift registers 233a1, 233a2, 233a3 and 233a4 configured to propagate the data value of controlling shift register 233a0 over the next four clock cycles, after which, on the fifth clock cycle, the data value of non-controlling shift register 233a4 propagates to one input of multiplexer 237a. The data value of non-controlling shift register 233a2 also propagates to another input of multiplexer 237a.

Shift register addressing assembly 236 includes one group of non-controlling shift registers 233b1, 233b2, 233b3 and 233b4, another group of non-controlling shift registers 233c1, 233c2, 233c4 and 233c4, and another group of non-controlling shift registers 233d1, 233d2, 233d3 and 233d4. Each of these groups operates in the manner previously described for group of non-controlling shift registers 233a1, 233a2, 233a3 and 233a4.

Group of non-controlling shift registers 233e1, 233e2, 233e3 and 233e4 operate differently in that they form part of the last row. In one embodiment, non-controlling shift registers 233e1, 233e2, 233e3 and 233e4 are not present, and the data shifted to controlling shift register 233e0 ends the shift register action. Because there is no row beyond row 232e, there is no need for a corresponding multiplexer.

Multiplexers 237a, 237b, 237c, and 237d may be configured to select between inputs based on a signal asserted onto input 239. Each multiplexer is configured in a like manner so that, in response to a first signal state asserted on input 239, multiplexer 237a selects the signal from non-controlling shift register 233a2, multiplexer 237b selects the signal from non-controlling shift register 233b2, multiplexer 237c selects the signal from non-controlling shift register 233c2, and multiplexer 237d selects the signal from non-controlling shift register 233d2. In response to a second signal state asserted on input 239, multiplexer 237a selects the signal from non-controlling shift register 233a4, multiplexer 237b selects the signal from non-controlling shift register 233b4, multiplexer 237c selects the signal from non-controlling shift register 233c4, and multiplexer 237d selects the signal from non-controlling shift register 233d4. The multiplexers 237a-237d allow selection of the number of non-controlling shift registers following each controlling shift register.

The multiplexers 237a-237d add flexibility into what would otherwise be a hardwired shift register addressing assembly. The selection of the length of the non-controlling shift registers may be done, for example, during initialization to allow for shorter shift register data sequences without increasing dead time during which no modulation would take place. In certain embodiments, a controller (e.g., controller 207 of FIG. 2A) may control input 239 to switch the length of the non-controlling shift registers between displayed frames, or at the times when the effect would not be visible on the display output. For example, switching from the longer to shorter shift register chain in conjunction with a slower clock rate may provide for changing conditions, such as switching to a nominal dark state of the display to reduce current flow. For example, changing the state of input 239 may require a reset of registers 233 to allow generator 208a to initiate an alternative shift register data sequence on input 238.

Figure 3A:
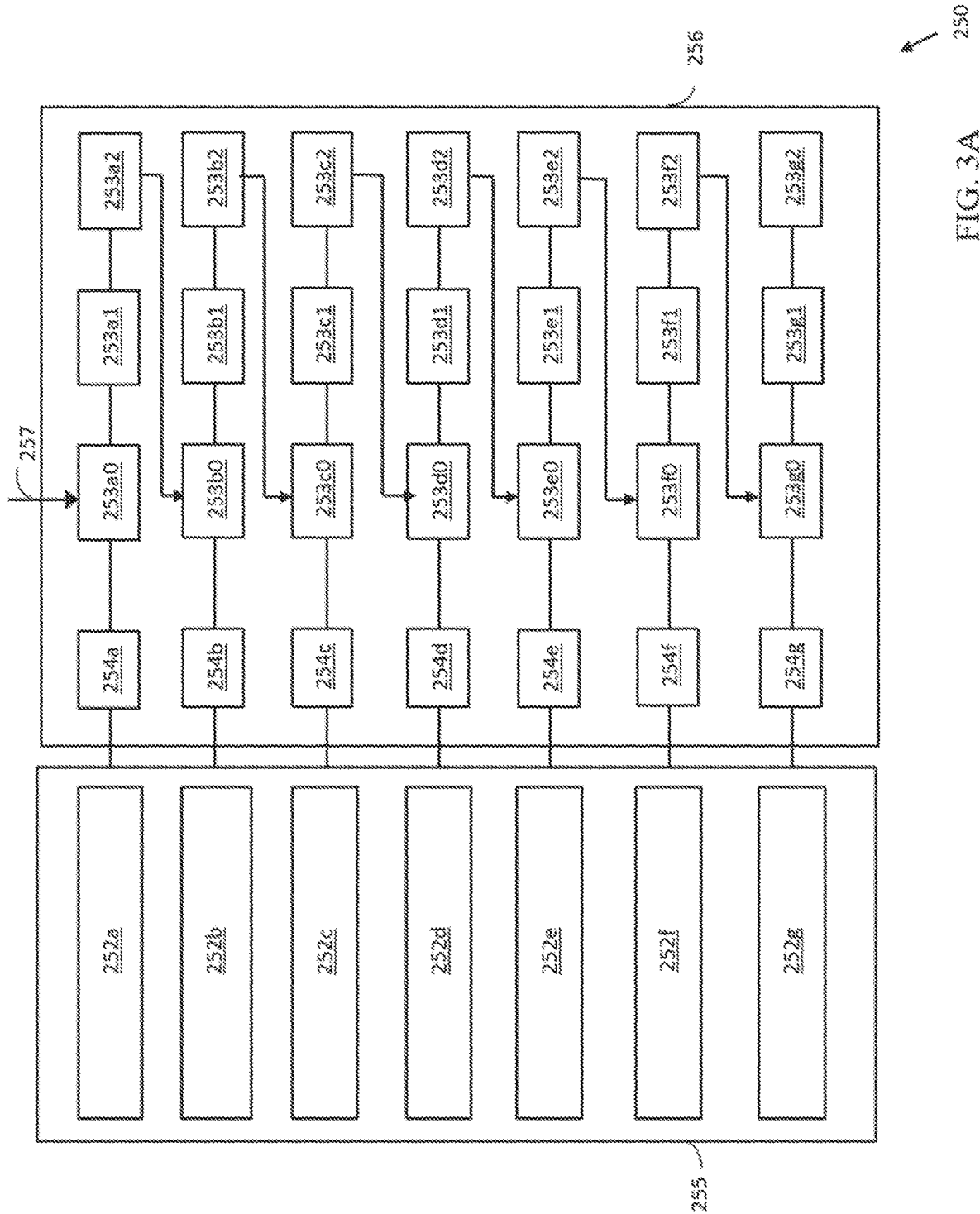
FIG. 3A presents a schematic block diagram of a modified shift register addressing assembly similar to that of FIG. 2A, in accord with one or more embodiments.

FIGS. 3A-3G present an operational example of a particular shift register data sequence used with a particular shift register addressing assembly that includes both controlling shift registers and non-controlling shift registers. FIG. 3A presents a simplified block diagram of an example backplane 250 that includes a shift register addressing assembly 256 and a row assembly 255. The layout is chosen to facilitate cross reference between the various figures.

Row assembly 255 includes rows 252a, 252b, 252c, 252e, 252e, 252f and 252g. Each row connects to a respective one of row drivers 254a, 254b, 254c, 254d, 254e, 254f and 254g of shift register addressing assembly 256.

Each row driver 254a, 254b, 254c, 254d, 254e, 254f and 254g is controlled by one respective controlling shift register 253a0, 253b0, 253c0, 253d0, 253e0, 253f0, and 253g0, in a similar manner as previously described. Row controlling shift register 253a0 receives a shift register data value over input 257, which determines the state of a word line (not shown) that is controlled by row driver 254a. For example, the shift register data value is part of a shift register data sequence. The shift register data value propagates through the shift registers of shift register addressing assembly 256 in response to a series of clock signals (not shown.) The clock signals cause the data value to propagate first to non-controlling shift register 253a1, then to non-controlling shift register 253a2. The next clock cycle propagates the data value to controlling shift register 253b0, which determines the state of row driver 254b. The next clock cycles cause the data value to propagate first to non-controlling shift register 253b1, and then to non-controlling shift register 253b2.

Further clock cycles propagate the shift register data value through controlling shift register 253c0, then through non-controlling shift registers 253c1 and 253c2, through controlling shift register 253d0, then through non-controlling shift registers 253d1 and 253d2, through controlling shift register 253e0, then through non-controlling shift registers 253e1 and 253e2, through controlling shift register 253f0, then through non-controlling shift registers 253f1 and 253f2, and controlling shift register 253g0.

In one embodiment, non-controlling shift registers 253g1 and 253g2 are not present and a shift register data sequence ends after controlling shift register 253g0. In one embodiment, a delay equivalent to the time required to sequence through non-controlling shift registers 253g1 and 253g2 is observed after the first value of the shift register data sequence propagates to controlling shift register 253g0, after which the first element of the shift register chain, 253a0, receives a new instance of the shift register data value in the shift register data sequence over input 257.

FIG. 3B presents an explanatory table 270 summarizing certain elements of shift register addressing assembly 256 of FIG. 3A, as an aid to presentation of specific data sequences further below. Explanatory table 270 places the controlling shift registers of shift register addressing assembly 256, FIG. 3A, in a column denoted as Shift Reg 0, and the non-controlling shift registers into two columns, Shift Reg 1 and Shift Reg 2. The shift registers on each row are linked together, consistent with their logical arrangement in FIG. 3A. The controlling shift register on each row receives a data value from either an external source, in the case of controlling shift register 253a0, or from the last non-controlling shift register of the previous row, in the case of all other controlling shift registers. A direction of data value movement is from left to right within each row, then from the last shift register in one row to Shift Reg 0 in the next row. For example, controlling shift register 253a0 of row 0 propagates its data value to non-controlling shift register 253a1 at the next clock cycle. At the next clock cycle after that, non-controlling shift register 253a1 propagates its data value to non-controlling shift register 253a2. At the next clock cycle, non-controlling shift register 253a2 propagates its value to controlling shift register 253b0 on the second row. The remainder of shift register addressing assembly 256 operates in the same manner (with possible exceptions for the last row, as noted above). The order in which the non-controlling shift registers appear for each row is one of the distinguishing features among them that results in each of the shift registers of a given row being considered in different groups. In explanatory table 270 of FIG. 3B all members of the controlling shift register group are found in column Shift Reg 0, all members of the first non-controlling shift register group are found in an intermediary position at column Shift Reg 1 and all members of the final non-controlling shift register group are found in an end position at column Shift Reg 2. The shift registers in each column, therefore, represent a common type with similar operating order and function. The reason for this organization is discussed below.

It is important to note that the columns of shift registers described are logical columns that may not be physically laid out in columns, but wherein each shift register that is a member of the same column has the same relationship to the shift registers of adjoining columns. In the present application, all columns of shift registers are considered to be logical columns whether or not the column is so indicated. Shift registers that are electrically connected to one another are considered to be logically adjacent or logically connected. In contrast, pixel drive circuits on the same row of the array of pixel drive circuits are physically laid out in adjacent columns. This may be important, because the pixel drive circuits perform the modulations that convert electrical signals into images. In addition to square or rectangular pixels, diamond and hexagonal shaped pixels are contemplated in some embodiments, and may use the same modulation techniques as described herein. Upon reading and understanding the present disclosure, one of ordinary skill in the art will readily recognize many extensions, equivalents and applications of the disclosed structures and techniques. Although the various shift registers of backplane 250 of FIG. 3A are depicted in physical columns, and the corresponding information in explanatory table 270 of FIG. 3B is organized in columns, neither of these schematic representations necessarily represent a physical layout of the underlying circuits.

The shift register addressing assemblies of previous examples may be organized in a similar manner as explanatory table 270. For example, in certain embodiments the shift registers of shift register addressing assembly 206 of FIG. 2A may be organized into a logical column of controlling shift registers 203$a0$ through 203$e0$, a logical column of first intermediary non-controlling shift registers 203$a1$ through 203$e1$, a logical column of second intermediary non-controlling shift registers 203$a2$ through 203$e2$, and a logical column of final non-controlling shift registers 203$a3$ through 302$e3$. Final non-controlling shift registers 203$a3$ through 203$d3$ each pass their data values to a controlling shift register of the next row, during the next clock cycle. Other shift register examples herein may be similarly organized. The order of the controlling and non-controlling shift registers may be reversed without affecting the overall functioning of the shift register addressing assembly.

FIGS. 3C-3H, 4A-D, and 5A-C show tables that illustrate example operation of embodiments herein over time, specifically illustrating how individual data values of a shift register data sequence propagate through shift registers in response to clock cycles, and how the shift register data sequence may be defined to enable rows for writing at different times. Time intervals are defined as occurring once per each clock cycle. In some of these tables, exemplary "1" and "0" data values contained in shift registers (for example, shift registers 203$a0$ . . . 203$a3$, 203$b0$ . . . 203$b3$, 203$c0$ . . . 203$c3$, 203$d0$ . . . 203$d3$, 203$e0$ . . . 203$e3$ shown in FIG. 2A) are explicitly provided. In others of the drawings, certain patterns of data values are expressed as "write pointers." Write pointers are patterns of data values in the shift register data sequence for a controlling shift register and non-controlling shift registers within a shift register chain during a time interval, wherein the data value for the controlling shift register is a logical "1" or high state being fed to a row driver. The row driver then operates the word line for a corresponding row, such that that row accepts data being fed by bitlines. Thus, when a write pointer is said to reside on a row at a particular time, that row is written.

FIG. 3C presents a write pointer sequence table 275 that illustrates propagation of data values through backplane 250 of FIG. 3A for a shift register data sequence that includes a plurality of write pointers Wp0, Wp1 and Wp2. Write pointer sequence table 275 represents forty-two time intervals where each time interval is a clock cycle that the shift register data sequence is advanced by one shift register. In this example, Wp0 is input to input 257 at clock cycle 1, as shown in col 1 of write pointer sequence table 275. A row spacing between write pointers Wp0 and Wp1 is one row and Wp1 is input to input 257 at clock cycle 5, as shown in time interval 5 of write pointer sequence table 275. A row spacing between write pointers Wp1 and Wp2 is two rows and Wp2 is input to input 257 at clock cycle 12, and is shown in time interval 12 of write pointer sequence table 275. A row spacing between write pointer Wp2 and the next instance of write pointer Wp0 (e.g., where the shift register data sequence repeats) is three rows and Wp0 is input to input 257 at clock cycle 22, and is shown in time interval 22 of write pointer sequence table 275. To ensure two rows are enabled at the same time, the spacing between Wp0 and Wp1 is four cycles (not three), since at clock cycle four, Wp0 propagates to enable row 2 as shown in time interval 4 of write pointer sequence table 275. Accordingly, in write pointer sequence table 275, only zero or one write pointer occurs in each time interval. Write pointer sequence table 275 of FIG. 3C may be created for backplane 250 where the shift register data sequence input to input 257 (e.g., the rows to which data is directed) is determined by a row decoder circuit and a controller system. The following text demonstrates how the same pattern of write pointers is created for shift register addressing assembly 256 of FIG. 3A to implement backplane 100 of FIG. 1A.

A bit plane defines the information to be displayed or output from a display device. For example, for each pixel drive circuit, the bit plane defines an output setting or control. In one example, the bit plane defines a pulse width modulation duration for the pixel drive circuit. In certain embodiments, each write pointer may correspond to a particular bit plane. Write pointer Wp0 being written to a row is considered to initiate a bit plane 0 on that row. Bit plane 0 terminates when a subsequent write pointer writes to that same row. In the example of FIG. 3C, bit plane 0 is initiated when write pointer Wp0 is written to row 252$a$ (designated as row 1 of write pointer sequence table 275) during time interval 1 and terminates when write pointer Wp1 is written to row 252$a$ during time interval 5. This concept may be extended to other write pointers, such as Wp1 and Wp2, as described further below. The duration of bit plane 0 is 4 time intervals. The duration of bit plane 1 (associated with a time span between Wp1 and Wp2) is 7 time intervals and the duration of bit plane 2 (associated with a time span between Wp2 and another instance of Wp0) is 10 time intervals. The relationship between row spacing and duration is not linear, but it is monotonic. Prior experience by applicant has shown that the linearity increases as the number of rows in the array and number of write pointers both increase.

Write pointer sequence table 275 begins with write pointer Wp0 at time interval 1 on row 1. Time intervals 2 and 3 have no write action because the shift register data sequence is just beginning (e.g., the duration of bit plane 0 has not expired in row 1, and rows 2 and higher have not yet been written to). Write pointer Wp0 is again written at time interval 4 on row 2, followed by write pointer Wp1 at time interval 5 on row 1, which terminates the data value set by write pointer Wp0 at time interval 1 on row 1. Time interval 6 has no write action because the duration of bit plane 1 has not expired in row 1, the duration of bit plane 0 has not expired in row 2, and rows 3 and higher have not yet been written to. Write pointer Wp0 is next written in time interval 7 on row 3, followed by write pointer Wp1 in time interval 8 at row 2, which terminates the data state set by write pointer Wp0 in time interval 4 on row 2. Time interval 9 has no write action for similar reasons as noted for time interval 6. Write pointer Wp0 is next written in time interval 10 on row 4, followed by write pointer Wp1 in time interval 11 on row 3, and write pointer Wp2 in time interval 12 on row 1. Write pointer Wp1 in time interval 11 on row 3 terminates the data value set by write pointer Wp0 in time interval 7 on row 3 and write pointer Wp2 terminates the data value set by write pointer Wp1 in time interval 5 on row 1. At this point all three write pointers have been introduced, so the full range of modulation allowed by the three write pointers over seven rows is fully active at that time.

The pattern described above is maintained over the succeeding time intervals. When a write pointer reaches the last row of the array—row 7 in this case—the next instance of that write pointer takes place on the top row of the array, at the next time interval during which that write pointer would appear. The next time the pattern of write pointers Wp0, Wp1, and Wp2 in time intervals 10, 11 and 12 repeats on the same rows, begins at time interval 31.

Write pointer sequence table 275 of FIG. 3C thus illustrates how row spacing may be used to create gray scale by propagating the pattern of write pointers across successive rows of the display over time. No two rows of the display are at exactly the same modulation point at any given time interval when using this modulation method. Note that a backplane such as prior art backplane 170 of FIG. 1C is normally written from top to bottom, in a series of operations when a shift register data sequence (not shown) passes down the rows in response to a series of clock cycles. Although functional, it is not sufficient to generate gray scale in a single pass unless all the pixel circuits (not shown) of the rows are analog and receive analog data. Generating gray scale with a pulse width modulation scheme using prior art backplane 170 requires many consecutive writings of the full backplane, the shortest of which defines the least significant bit of image data that can be displayed. This is inefficient compared to the modulation method described in the MegaMod patents, which disclose a method that supports a more even data bandwidth requirement, without substantial peaks and valleys in data transfer, that accomplishes the same modulation goal.

The time relationship between the modulation of adjacent rows of the display is illustrated through analysis of selected time intervals of write pointer sequence table 275 of FIG. 3C. At time interval 21, write pointer Wp2 of row 2 is on its 7th time interval of the 10 time intervals that began at time interval 15 until that row is rewritten, write pointer Wp2 of row 3 is on its $4^{th}$ time interval of the 10 time intervals that began at time interval 18 until that row is rewritten, and write pointer Wp2 on row 4 is on its first time interval of the 10 time intervals until that row is rewritten. The act of rewriting terminates the previous data state and initiates a new data state. The previous data state and the new data state replacing it may be the same, or may differ.

In a second example, at time interval 23, write pointer Wp1 of row 5 is at the $7^{th}$ time interval of 7 time intervals, write pointer Wp1 of row 6 is at the $4^{th}$ time interval of 7 time intervals that began at time interval 20, and write pointer Wp1 of row 7 is at the first time interval of 7 time intervals. This analysis holds up across all rows and time slots and illustrates how adjacent rows are not in precisely the same modulation state.

Another advantage of the modulation method over the modulation method described above in conjunction with prior art backplane 170 of FIG. 1C is that the duration of a least significant bit (1sb) is allowed to be shorter in duration. Assuming a backplane of seven rows (not shown) rather than the five rows of prior art backplane 170, an 1sb started on the first row is not ended until all other rows have been written and that row is then rewritten. Thus, the duration of an 1sb is at minimum 7 time intervals. Some types of dither may be applied to reduce the appearance of this, but these all involve extra controller software. The analysis above teaches that a minimum duration 1sb of four time intervals is possible with backplane 250 of FIG. 3A operated as described for FIG. 3C. When a backplane includes a significantly larger number of rows, the advantage of being able to create least significant bits of shorter duration than the time required to write the entire array is significant and advantageous.

These advantages and features are important because they permit operation of a properly configured backplane in an efficient manner.

Figure 3D:
FIG. 3D presents a table of shift register data states versus sequential time intervals generated by the write pointer of FIG. 3C, in accord with one or more embodiments.

FIG. 3D presents a shift register data sequence table 280, which depicts an alternate view of the full set of data values for a shift register data sequence, for all seven rows of backplane 250 of FIG. 3A, when using the write pointer sequence described in FIG. 3C. Shift register data sequence table 280 shows how data propagates through the physical layout of the shift registers of backplane 250 of FIG. 3A, and thus indicates when data is written on the rows driven by controlling shift registers 253a0, 253b0, 253g0. Going left to right across each time interval, the values for each time interval and row combination represent the three values, either 0 or 1 or a combination thereof, in each block represent the value of the controlling shift register followed by the values in the two non-controlling shifter registers in the same order that they are depicted in backplane 250. Initial data values of all shift registers 253 of shift register addressing assembly 256 of FIG. 3A may be set to a data value of 0 through a reset function.

Note that previous examples illustrated movement of a single shift register data value through a series of shift registers. The reality is that a comprehensive series of data values for all the shift registers move through the shift register responsive to a clock signal. The values in the shift register data sequence may be set up to cause shift registers 253 of shift register addressing assembly 256 to operate in the fashion desired.

In a first example of shift register data sequence table 280, a shift register data sequence in rows 1 and 2, from time interval 1 up to time interval 12, with selected additional time intervals afterward, is discussed. Each set of data values for one row 252 is presented as ABC, where A is the data value in the controlling shift register for the indicated row, while B and C are the data values in the non-controlling shift registers for the indicated row. Thus, row 1 in time interval 1 shows data values of 100, which means that controlling shift register 253a0 is set to 1, while non-controlling shift registers 253a1 and 253a2 are set to 0. In time interval 2, the shift register data sequence moves by a clock signal by one shift register and reads 010 for row 1 in shift register data sequence table 280. Thus, controlling shift register 253a0 is set to 0, non-controlling shift register 253a1 is set to 1 and non-controlling shift register 253a2 is set to 0. The 0 data value in non-controlling shift register 253a2 is moves to controlling shift register 253b0 on row 2, and so forth, but in this example merely replaces a previous data value of 0. Note that because no entries in time interval 2 begin with a data value of 1, none of the controlling shift registers are active, and no writing to the array takes place.

In time interval 3, the shift register data sequence moves by a clock signal by one shift register, so that the data values for time interval 3 begin with 001 for row 1. Thus, controlling shift register 253a0 and non-controlling shift register 253a1 are each set to 0, and non-controlling shift register 253*a*2 is set to 1. Because no entries in time interval 3 begin with a data value of 1, none of the controlling shift registers are active, and no writing to the array takes place.

In time interval 4, the shift register data sequence is moved by the clock signal so that the data values for time interval 4 for rows 1 and 2 begin with 000 100. Thus, controlling shift register 253*a*0 and non-controlling shift registers 253*a*1 and 253*a*2 of row 1 are all set to 0, and controlling shift register 253*b*0 of row 2 is set to 1. This concurs with write pointer sequence table 275 of FIG. 3C.

In time interval 5, the shift register data sequence on is moved by a clock signal by one shift register so that the data values for time interval 5 begin with 100 010 for rows 1 and 2. Controlling shift register 253*a*0 is set to 1, and non-controlling shift registers 253*a*1 and 253*a*2 are set to 0, as is controlling shift register 253*b*0. Non-controlling shift register 253*b*1 is set to 1, and non-controlling shift register 253*b*2 is set to 0.

Like time intervals 2 and 3, time interval 6 has no controlling shift registers active. Time intervals 7 and 8 repeat the pattern for write pointers Wp0 and Wp1 on rows 3 and 2 previously shown in time intervals 4 and 5, on rows 2 and 1, therefore may be considered to provide writing action that is offset by one row, as compared with the data values of time intervals 4 and 5.

Like time intervals 2, 3 and 6, time interval 9 has no controlling shift registers active. Time intervals 10 and 11 repeat the pattern for write pointers Wp0 and Wp1 previously noted for time intervals 4 and 4 and for time intervals 7 and 8, with an offset of one row as compared with the most immediate prior instance at time intervals 7 and 8. In time interval 12, write pointer Wp2 is written with an offset of two rows as compared with the most immediate instance of write pointer Wp1 in time interval 11. At this point, all three write pointers are now present on the system of backplane 250 of FIG. 3A.

Inspection of shift register data sequence shows that no time interval higher than time interval 9 has any instance in which no write action takes place. There is also no instance in which more than one row is being written to (e.g., has its word line pulled high by a data value of 1 in one of controlling shift registers 253*a*0, 253*b*0, 253*g*0). The write pointer sequence found in time intervals 10, 11 and 12 where write pointer Wp0 is on row 4 in time interval 10, write pointer Wp1 is on row 3 in time interval 11 and write pointer Wp2 is on row 1 in time interval 12 is next repeated at time intervals 31, 31 and 33. The repetition occurs because when a write pointer reaches row 7 (e.g., row 252*g*) its next instance takes place on row 1 (e.g., row 252*a*.)

For example, write pointer Wp0 on row 7 (252*g*) at time interval 19 next appears on row 1 (252*a*) at time interval 22. Also note that bit plane 0 (not shown) for row 7 (252*g*) that begins at time interval 19 is terminated 4 time intervals later, when write pointer Wp1 is written to row 7 (252*g*) in time interval 23.

Shift register data sequence table 280 of FIG. 3D illustrates the write pointers presented in write pointer sequence table 275 of FIG. 3C. All points (e.g., intersections of rows with time intervals) at which a row has a write pointer in write pointer sequence 275 has a 100 at the same point (row and time interval) in shift register data sequence table 280, indicating that the controlling write pointer at that point is bringing a word line high, and that the two non-controlling shift registers have 0 data values. Note that it is not prohibited to have a sequence at one any one point of 111, but it may not be useful for a practical modulation based on a shift register data sequence scheme. In the case of a 111 sequence, the corresponding row assembly would be subject to two short bursts and one very long one, which would not result in significant gray scale generation.

The previous examples illustrate construction of a shift register data sequence usable to operate the word line of non-contiguous rows in a time ordered manner that creates gray scale modulation. Each usable shift register data sequence has characteristics that may be used to develop other usable shift register data sequences.

A premise of the construction of the shift register addressing assembly for the present invention, such as that of shift register addressing assembly 256 of FIG. 3A, is that each row of the display has one row driver (e.g., row drivers 254*a*-254*g*) that is controlled by a single controlling shift register (e.g., controlling shift registers 253*a*0-253*g*0) respectively. Each row driver 254*a* through row driver 254*g* controls one word line (not shown) of a respective row 252*a*-252*g* of row assembly 255. Each row of shift register addressing assembly 256 further includes a like number of non-controlling shift registers (with the possible exception of the last row). In the example of shift register addressing assembly 256 of FIG. 3A, each row includes a first non-controlling shift register 253*a*1 through non-controlling shift register 253*g*1 which receives its data value from the corresponding controlling shift register 253*a*0-253*g*0 respectively, during each clock cycle, and also includes a second non-controlling shift register 253*a*2-253*g*2, which receives its data value from the adjacent first non-controlling shift register of the same row during each clock cycle. The shift register data sequence advances from the second non-controlling shift register of each row (e.g., 253*a*2-253*f*2) to the controlling shift register 253*b*0 through 253*g*0 of the next row.

What happens on the last row, depends on whether optional, non-controlling shift registers 253*g*1 and 253*g*2 are present or not. In certain embodiments wherein non-controlling shift registers 253*g*1 and 253*g*2 are present, the two shift registers may be operated as described above, and the shift register data value in non-controlling shift register 253*g*2 may be asserted onto the input to controlling shift register 253*a*0 in response to a clock cycle. When non-controlling shift registers 253*g*1 and 253*g*2 are absent, other circuitry typically provides data values to controlling shift register 253*a*0.

There are sound reasons to want to regulate the timing of shift register addressing assembly 256 more tightly than is possible using the characteristics of LTPS or other related materials alone. Single crystal silicon has superior timing performance, so there is some advantage to not having non-controlling shift register 253*g*1 and 253*g*2 in the loop for timing purposes. A display controller (not shown) as described earlier may perform this function. Typically, a time delay equivalent to the time required to clock through both non-controlling shift register 253*g*1 and 253*g*2 is created, although some adjustment may be made to keep the modulation synchronized to the incoming data.

Backplane 250 implements shift register row addressing that is configurable to control modulation. A shift register data sequence is defined for a specific shift register arrangement to implement the desired modulation. For example, in embodiments a shift register data sequence is arranged such that no word line of more than one row of a shift register arrangement is high at any given time interval. In embodiments where there are separate column register assemblies, for example, in which one column register assembly supplies data to even rows and another supplies data to odd rows, this restriction may still apply to the separate sets of even rows and odd rows.

FIGS. 3E, 3F and 3G present detailed data value tables 285, 290 and 295, which are more detailed tables of the data values of the shift registers of table 280 of FIG. 3D from time interval 6 to time interval 32. FIG. 3E includes detailed data value table 285 of time interval 6 to time interval 14; FIG. 3F includes detailed data value table 290 of time interval 15 to time interval 23; and FIG. 3G includes detailed data value table 295 of time interval 24 to time interval 32. The restricted number of time intervals presented is sufficient to illustrate the advantages of a shift register data sequence that is operative to pulse width modulate a backplane that includes a plurality of rows constructed with a modified shift register addressing assembly. It will be shown that the specific shift register data sequence is operative to activate non-adjacent rows in a time ordered sequence by controlling the activation of the word lines of those rows. Note that some rows in a sequence may be adjacent to each other, but not all rows need be adjacent to another.

The header terms SReg 0, SReg 1 and SReg 2 of FIGS. 3E, 3F and 3G illustrate how data values propagate through the controlling shift register, the first non-controlling shift register, and the second non-controlling shift register of each row of shift register addressing assembly 256, FIG. 3A. The entries under SReg 0 correspond to the data values in controlling shift registers 253a0, 253b0, 253c0, 253d0, 253e0, 253f0 and 253g0 at each of the time intervals noted (e.g., all the shift registers listed in the Shift Reg 0 column of explanatory table 270 of FIG. 3B). The entries under SReg 1 correspond to the data values of the first non-controlling shift registers (e.g., as listed under the Shift Reg 1 column of explanatory table 270) and the entries under SReg 2 correspond to the data values of the second non-controlling shift registers (e.g., as listed under the Shift Reg 2 column of explanatory table 270). The rows of FIGS. 3E, 3F and 3G correspond to the rows listed in FIG. 3B.

In a first point of comparison, the data for time intervals 6 and 9 of detailed data value table 285 of FIG. 3E both show the value of SReg 0 for all rows to be 0, consistent with the above description of shift register data sequence table 280, FIG. 3D, which explains that both of time intervals 6 and 9 involve no write action.

Looking at time intervals 10, 11 and 12 of write pointer sequence table 275, FIG. 3C, write pointer Wp0 is found on row 4 at time interval 10; write pointer Wp1 is found on row 3 at time interval 11; and write pointer Wp2 is found on row 1 at time interval 12. Comparing this to detailed data value table 285 for the same time intervals, a data value of 1 is found on row 4 at time interval 10, a data value of 1 is found on row 3 at time interval 11, and a data value of 1 is found on row 1 at time interval 12. This positions and timing of the data values shown in detailed data value table 285 thus reflect the positions of write pointers Wp0, Wp1 and Wp2 in write pointer sequence table 275.

In detailed data value table 285, a data value of 1 indicates bringing the word line of a row high (or low, depending on the design of the memory circuits of the pixel drive circuits of the row), enabling data to be written to the memory circuits of that row. Looking first at write pointer Wp0 written to row 4 at time interval 10, according to write pointer sequence table 275 of FIG. 3C, row 4 is next written at time interval 14 by write pointer Wp1. Looking at detailed data value table 285 at time interval 14, SReg 0 is again high at that time. Inspection of time intervals 11, 12 and 13 reveals that row 4 of SReg 0 is not written during those time intervals, so the data values of the memory circuits of row 4, that were established at time interval 10, do not change until time interval 14.

According to write pointer sequence table 275 of FIG. 3C, write pointer Wp1 is written to row 3 at time interval 11. Row 3 is next written at time interval 18 by write pointer Wp2, with no intervening data written to that row. Comparing this to the data value for time interval 11 in detailed data value table 285 of FIG. 3E and the data for time interval 18 in detailed data value table 290 of FIG. 3F, SReg 0 for time interval 11 has a 1 on row 3 and SReg 0 for time interval 18 has a 1 on row 3. There are no intervening time intervals with a 1 on row 3 under SReg 0. This completely correlates write pointer Wp1 on row 3 at time interval 11 to the data presented on detailed data value table 285 of FIG. 3E at time interval 11 on row 3 and also correlates write pointer Wp2 on row 3 at time interval 18 on write pointer sequence table 275 of FIG. 3C to the data presented on detailed data value table 290 at time interval 18 on row 3.

Further analysis yields the same results between the write pointers of write pointer sequence table 275 and the data presented on detailed data value tables 285 of FIG. 3E, 290 of FIG. 3F and 295 of FIG. 3G. Thus, it is demonstrated that a shift register data sequence may be developed that, when used on a modified shift register addressing assembly as disclosed in this application, is operative to impose a pulse width modulation scheme that creates gray scale through the use of a variety of row spacings between subsequent write pointers.

With respect to write pointer sequence table 275, a repeating pattern with row offsets between repetitions is clearly shown. For example, the pattern of time intervals 10, 11 and 12 shows write pointer Wp1 at row 4, write pointer Wp1 one row above write pointer Wp0 at row 3 and write pointer Wp2 two rows above write pointer Wp1 at row 1. The pattern repeats with one row offset beginning at time interval 13, where write pointer Wp0 is shown at row 5, one row below write pointer Wp0 of time interval 10, followed by write pointer Wp1 on row 4 in time interval 14, one row below the position of write pointer Wp1 on row 3 at time interval 11, and then followed by write pointer Wp2 on row 2 at time interval 14, one row below the position of write pointer Wp2 on row 1 at time interval 12. The pattern repeats for time intervals 16, 17 and 18 and for time intervals 19, 20 and 21. At time interval 22, there is no row 8 for write pointer Wp0 to move to so it is instead restarted during that time interval on row 1.

Thus, there is complete correlation of tables 270, 275 and 280 to detailed data value tables 285 and 290 at each point. The correspondence for time intervals 10, 11 and 12 has already been demonstrated. Detailed data value table 285 shows SReg 0 having a data value of 1 on row 5 at time interval 13 and having a data value of 1 on row 4 at time interval 14. Detailed data state table 290 shows SReg 0 having a data value of 1 on row 2 at time interval 15.

The correspondence among data tables 270, 275, 280 and 290 for time intervals 16, 17 and 18 and for time intervals 19, 20 and 21 may be shown in a similar manner. At time interval 19 in write pointer sequence table 275, write pointer Wp0 appears on row 7, (e.g., the last row of backplane 250, FIG. 3A). The next instance of write pointer Wp0 is found on row 1 at time interval 22. The correlation to detailed data value table 290 holds, as a data value of 1 is found on SReg 0 at that time interval.

The previous examples have shown how row spacing creates gray scale when using a modified shift register addressing assembly that includes controlling shift registers—one for each row—able to pull or have pulled a word line high when placed in a high state, and that also includes non-controlling shift registers wherein the number of non-controlling shift registers is identical for each row (with the possible exception of the last row, where the number of non-controlling shift registers following the last controlling shift register may be zero).

The data presented in detailed data value tables 285, 290 and 295 of FIGS. 3E, 3F and 3G illustrate constraints that may be advantageously used to successfully implement a shift register data sequence such as illustrated in shift register data sequence table 280 of FIG. 3D.

In each time interval of detailed data value tables 285, 290 and 295, no more than one of SReg 0, SReg 1 and SReg2 contains a value of 1. As a first example, consider the three columns of time interval 6, in detailed data value table 285. The first column SReg 0 has no shift register containing a value of 1; column SReg 1 has only the shift register on row 1 containing a value of 1, and column SReg 2 has only the shift register on row 2 containing a value of 1. Considering time interval 11, the shift register data value in SReg 0 is 1 on row 3; the shift register data value in SReg 1 is 1 on row 4, and the shift register data value on SReg 2 is not 1 on any row. Considering time interval 14, the shift register data value in SReg 0 is 1 on row 4; the shift register data value in SReg 1 is 1 on row 5, and the shift register data value in SReg 2 is 1 on row 1. In another example, considering time interval 20, the shift register data value in SReg 0 is 1 on row 6; the shift register data value in SReg 1 is 1 on row 7 and the shift register data value in SReg 2 is 1 on row 3. Considering all other time intervals in SReg 0, SReg1 and SReg 2 reveals that none of the columns has more than one shift register containing a high data value in each column.

FIG. 3H illustrates a detailed data value table 298 which illustrates what (disadvantageously) happens when more than one shift register data point is high in a column of the table (e.g., for one of SReg 0, SReg 1, or SReg 2, but in different rows) at the same time. Detailed data value table 298 presents a simplified shift register data sequence over time intervals a through f wherein the time intervals occur in alphabetical order. These time intervals do not correspond to any of the time intervals of FIGS. 3E-3G. Detailed data value table 298 uses the configuration of backplane 250 of FIG. 3A, and the headers and row references are the same as for FIGS. 3E-3G.

Table 298 includes two instances, at time interval a, of a data value of 1 located in column SReg 1 on rows 1 and 4, corresponding to data stored on non-controlling shift registers 253a1 and 253d1 of backplane 250 of FIG. 3A. But because non-controlling shift registers 253a1 and 253d1 are non-controlling shift registers, the presence of data values of 1 within them has no effect on the word lines associated with row 1 and row 4.

In the following time interval b, two instances of data values of 1 are located in column SReg 2 on rows 1 and 4, corresponding to data stored on non-controlling shift registers 253a2 and 253d2 of backplane 250 of FIG. 3A. Again, because non-controlling shift registers 253a2 and 253d2 are non-controlling shift registers, the presence of data values of 1 within them has no effect on the state of the word lines associated with row 1 or row 4.

In time interval c, the two instances of a data value of 1 are located in column SReg 0 on rows 2 and 5, corresponding to the data stored on controlling shift registers 253b0 and 253e0. Because controlling shift registers 253b0 and 253e0 are controlling shift registers, the presence of data values of 1 within both of them causes the associated row drivers 254b and 254e to raise the word lines for row 252b and 252e to an on state.

The same sequence is repeated in time interval d and time interval e with the shifter register data values for non-controlling shift registers 253b1 and 253b2 and for non-controlling shift registers 253e1 and 253e2 operating in a similar manner as before. In time interval f, the two instances of data values of 1 are again moved to column SReg 0 on rows 3 and 6, corresponding to controlling shift registers 253c0 and 253f0. Again, the word lines for rows 3 and 6 are both moved to an on state. This creates a state specifically determined previously to be disadvantageous, because the data to be written to a row should not be written to more than one row. As a general rule, it is not desirable for a shift register data sequence, in accord with one or more embodiments, to be constructed such that, at any time, more than one element of a set of shift registers of a common type has a data value of 1.

If a shift register data sequence is longer—possesses more data elements—than the physical shift registers of a shift register array, then use of the shift register data sequence with the shift register array may be acceptable, provided no shift registers of a common type are populated with more than one data value of 1 during any given time interval. This conclusion is in addition to the previous conclusion that a successful shift register data sequence may be constructed by using no more than one data element in a column representing the data states of a common type of shift register.

FIGS. 4A-4E provide an example where a shift register data sequence defines more write pointers than a number of shift registers on each row. FIGS. 4A-4E are based on backplane 250, FIG. 3A, and on explanatory table 270, FIG. 3B.

FIG. 4A presents an example of a write pointer sequence table 300 wherein a total number of write pointers (e.g., six-Wp0-Wp5) is greater than a number of shift registers (e.g., three—253a0, 253a1, and 253a2 for row 252a) on each row. The number of shift registers active in the shift register data sequence does not exceed the number of groups of shift registers, as previously described. That is, only one row has an active word line in any time interval.

Write pointer sequence table 300 of FIG. 4A is identical to write pointer sequence table 275 of FIG. 3C for time intervals 1 through 21. Then, unlike write pointer sequence table 275 where the shift register data sequence repeats with Wp0 on row 1 at time interval 22, write pointer Wp3 occurs on row 1 at time interval 22intable 300. After time interval 22, the time intervals and row positions of all remaining instances of write pointer Wp3 in write pointer sequence table 300 are the same as the remaining instances of write pointer Wp0 in write pointer sequence table 275. Accordingly, the duration of 10 time intervals of the bit planes initiated by write pointer Wp2 is the same in write pointer sequence tables 275 and 300. Write pointer Wp3 is terminated by write pointer Wp4, creating a bit plane of 7 time intervals duration. Write pointer Wp4 is terminated by write pointer Wp5, creating another bit plane of 7 time intervals duration. The last instance of write pointer Wp5 on row 1 at time interval 36 is at least seven time intervals in duration at the end of write pointer sequence table 300. (Whether write pointer Wp5 is seven time intervals, or longer in duration depends on what happens during time interval 43 and any ensuing time intervals, not depicted here).

Note that while write pointer Wp3 falls into time intervals and rows beginning at time interval 22 in write pointer sequence table 300, that were occupied by an instance of write pointer Wp0 in write pointer sequence table 275, FIG. 3C, the same is not true of write pointer Wp4 with respect to write pointer Wp1, or of write pointer Wp5 with respect to write pointer Wp2, in write pointer sequence table 300.

In the example of write pointer sequence table 300, time intervals that follow time interval 42 could utilize additional write pointers in a different pattern, or a continuation of the pattern initiated at time interval 22. In the former case, the next pattern may be designed based on the rules presented herein. In the latter case, a continuation of the existing pattern may be used to close out the modulation sequence. The continuation may involve setting the data value of the last example of write pointer Wp3 on each row to 0, so that the bit planes have no data at the end. It may also involve further instances of write pointers Wp4 and Wp5, until these write pointers reach the last row, and then terminate. It may be seen that propagating write pointer Wp3 to the last row (e.g., to erase the last instance of Wp5 with data on it) takes 20 additional time intervals. Another method that may be used to close out the modulation sequence is to use a shift register reset function to set all shift register data values to 0.

FIG. 4B presents a shift register data sequence table 305, which illustrates possible shift register data states of the individual shift registers of FIG. 3A in the same manner as shift register data sequence table 280 of FIG. 3D. The sequence for time intervals 1 to 21 of shift register data sequence table 305 is identical to that of shift register data sequence table 280. At time interval 22, the shift register data values for row 1 are 100, which correspond to the data values for write pointer Wp3 on row 22 at time interval 22 of write pointer sequence table 300. At time interval 23, the shift register data values for row 7 are 100, which correspond to the data values for write pointer Wp1 at time interval 23 of write pointer sequence table 300. At time interval 24, the shift register data values for row 5 are 100, which correspond to the data values for write pointer Wp2 at time interval 24 of write pointer sequence table 300. At time interval 25, the shift register data values for row 2 are 100, which correspond to the data values for write pointer Wp3 at time interval 25 of write pointer sequence table 300.

At time interval 26, the last instance of write pointer Wp1 occurs. Wp1 is not carried over in tables 300 and 305, thus the correspondence between tables 300 and 305, as compared with tables 275 and 280, differs for certain time intervals at time interval 26 and beyond. For example, by inspection, no row has shift register data values of 100 for time interval 26 in tables 300 and 305, and therefore no write action takes place on any row at time interval 26.

At time interval 27, the shift register data for row 6 is 100, which corresponds to the data values for write pointer Wp2 on row 6 at time interval 27 in write pointer sequence table 300. By inspection, the propagation of shift register data values of 100 from time intervals 28 to 32 in shift register data sequence table 305, corresponds to the row position of the write pointers of time intervals 28 to 32 illustrated in write pointer sequence table 300.

At time interval 30, another instance of write pointer Wp2 occurs on row 7 in write pointer sequence table 300. No further instances of write pointer Wp2 occur in the following time intervals in write pointer sequence table 300. At time interval 33, no shift register data values of 100 are found in shift register data sequence table 305, so no write action takes place on any row.

At time intervals 34 through 36, shift register data 100 is found in shift register data sequence table 305 at rows 5, row 3 and row 1 respectively, which correspond to the positions of write pointers Wp3, Wp4 and Wp5 in those time intervals in write pointer sequence table 300. A similar pattern is repeated for time intervals 37 through 39 and for time intervals 40 through 42, as may be determined by inspection of both tables 300 and 305.

FIGS. 4C, 4D and 4E present more detailed tables of the data values of the shift registers from time interval 19 to time interval 42, hereafter detailed data value tables 310, 315 and 320. FIG. 4C includes detailed data value table 310 of time interval 19 to time interval 27; FIG. 4D includes detailed data value table 315 of time interval 28 to time interval 36; and FIG. 4E includes detailed data value table 320 of time interval 37 to time interval 42. The restricted number of time intervals presented is sufficient to illustrate the point that a shift register data sequence may be longer than the total number of shift registers present in a shift register addressing assembly. In this example, shift register data sequence table 305 of FIG. 4B is identical to shift register data sequence table 280 of FIG. 3D until time interval 26. Time interval 26 has no write action on its shift registers because of the changes caused by the differences in the position of write pointers Wp4 and Wp5 relative to write pointer Wp3 (see FIG. 4A) as compared to the position of write pointers Wp1 and Wp2 relative to write pointer Wp0 (see FIG. 3C). Note that write pointer Wp3 occupies the same rows and time intervals in write pointer sequence table 300 of FIG. 4A, as write pointer Wp0 of write pointer sequence table 275 of FIG. 3C, beginning at time interval 22.

In FIGS. 4C, 4D and 4E, all of the shift registers SReg 0 across rows 252a-252g may be considered a first group, all of the shift registers SReg 1 across rows 252a-252g may be considered a second group, and all of the shift registers SReg 2 across rows 252a-252g may be considered a third group. By inspection, at any given time interval within time intervals 19 through 42, each of these three groups of shift registers possesses at most one shift register having a data value of 1. This demonstrates that no more than one row has its word line activated by a shift register at any given time interval.

The rules for establishing a shift register data sequence to perform like the sequence just shown include several features. The first rule, already stated, is to ensure that no more than one shift register, of a set of shift registers in a same logical position, has a data value of 1 at any given time. Because the sequence requires more than one data state on shift registers of a common type, this imposes a timing requirement on the shift register data sequence.

In comparing write pointer sequence table 300, FIG. 4A with write pointer sequence table 275, FIG. 3C, write pointer Wp0 is replaced by write pointer Wp3 at time interval 22. All instances of write pointer Wp3 occur during time intervals and on the rows where write pointer Wp0 of write pointer sequence table 275 of FIG. 3C previously occurred. This preserves the duration of the bit planes initiated by write pointer Wp2 in FIG. 4A, as compared with similar bit planes illustrated in FIG. 3C. Then, in FIG. 4A, write pointer Wp4 of write pointer sequence table 300 is generally analogous to write pointer Wp1 of write pointer sequence table 275, FIG. 3C. However, write pointer Wp4 is introduced at time interval 29 at row 1 of write pointer sequence table 300, whereas write pointer Wp1 is introduced for a second time, at time interval 26 on row 1 on write pointer sequence table 275. This is a shift in timing of 3 time intervals between the two write pointer sequences, causing the duration of the bit plane initiated by write pointer Wp3 of write pointer sequence table 300 to have a duration of seven time intervals, whereas the duration of bit planes initiated by write pointer Wp0 of write pointer sequence table 275 initiated on the same rows and time intervals was only four time intervals.

Continuing on write pointer sequence table 300 of FIG. 4A, the bit plane initiated by write pointer Wp4 on row one at time interval 29 is terminated by write pointer Wp5 at time interval W36, for a duration of seven time intervals. The bit plane initiated by write pointer Wp5 on row 1 is not terminated in the example. However, inspecting time interval 40, write pointer Wp3 is found on row 7, which indicates that time interval 43 (not shown) would be the next instance where a write pointer from the group containing both write pointers Wp0 and Wp3 would occur on row 1 at time interval 3. In either case, the duration of the bit plane initiated by write pointer Wp5 would be seven.

Following the example of FIG. 4A, the illustrated example yields one bit plane of 4 time intervals duration, four bit planes of seven time intervals duration and one bit plane of 10 time intervals duration. The four bit planes of seven time intervals duration may be operated as thermometer bits. That means that through manipulation of the data values of the memory circuits in the pixel drive circuits, a bit plane of 7 time intervals duration at a first position in the sequence of bit planes may be placed into an on state first in all instances. A bit plane of 7 time intervals duration at a second position of the sequence of bit planes may be placed in an on state second in all instances. A bit plane of 7 time intervals duration at a third position in the sequence of bit planes may be placed in an on state third in all instances and a bit plane of 7 time intervals duration may be placed in an on state fourth in all instances. This means that if a pixel and its neighbor are both in an on state, and one has a first thermometer bit active and the second has the first and second thermometer bits active, the first thermometer bits occur at the same time in the modulation sequence and have no phase difference between them at that point.

The benefit that accrues from this is a reduction in the prevalence of image defects such as dynamic false contours and liquid crystal lateral field effects that are well known in the art. The general idea is that it reduces data phase timing differences between adjacent pixel through the use of the thermometer bits as described. This solution has been implemented by Applicant in practical applications and is documented in its previous patent applications.

In write pointer sequence table 300, write pointer Wp4 could be introduced at positions other than during time interval 29 on row 1. For example, it could be placed at time interval 26 on row 1, although this would not differ from the placement of write pointer Wp1 at time interval 26 on row 1 on write pointer sequence table 275 of FIG. 3C. Write pointer Wp4 could also be introduced at time interval 32 on row 1, which would change the duration of the bit plane initiated by write pointer Wp3 at time interval 22 from 7 time intervals to 10 time intervals.

This also would change the duration of the bit plane initiated by write pointer Wp4 at time slot 32 on row 1 to four time intervals if write pointer Wp5 remains at time slot 36 on row 1. If write pointer Wp5 is moved to time interval 39 on row 1 then the duration of the bit plane initiated by write pointer Wp4 at time interval 32 on row 1 is 7 time intervals in duration when terminated by write pointer Wp5 at time interval 39 on row 1.

Thus it is demonstrated that some flexibility in the development of a write pointer sequence may allow bit planes of differing durations to be developed. As a practical matter, each application may require a degree of investigation of alternatives in order to select the best of the available alternatives.

The following is a summary of the various steps required to formulate a shift register data sequence previously disclosed in this application. Upon reading and understanding the present disclosure, one of ordinary skill in the art will be able to develop the various tables and other aids described herein, electronically or physically (e.g., on paper) depending on the complexity of the backplane and shift register structure that the shift register data sequence is intended for.

The information provided in backplane 250 of FIG. 3A and explanatory table 270 of FIG. 3B provide the basis for constructing a write pointer sequence that may be implemented using a shift register data sequence such as that presented in shift register data sequence table 280, FIG. 3D, or in shift register data sequence table 305, FIG. 4B.

Backplane 250 of FIG. 3A includes seven rows, each row of which is associated with one controlling shift register and two non-controlling shift registers as previously noted. The shift registers may be organized into an array that is 3 columns across by 7 rows down. This corresponds to the three right columns of explanatory table 270 of FIG. 3B. The rows are indicated for ease of reference and the row drivers are included for completeness. As noted above for certain embodiments, the non-controlling shift registers for the last row are not present and the backplane controller adjusts the timing accordingly. For example, the controller may adjust timing of subsequent shift register data sequences through the shift register chain of the shift register assembly. The controller may adjust timing of subsequent shift register data sequences at least to match an input image data frame rate, for example. Experience has shown that it may be difficult to match an output frame rate to an input data rate when the output is in the form of bit planes.

The more general case for a shift register addressing assembly is that it includes N rows, each with M shift registers with the possible exception of the last row (which may, in some embodiments, have no non-controlling shift registers positioned after the last controlling shift register, as noted above). One and only one controlling shift register is associated with each of the N rows, and each row is associated with an identical number of non-controlling shift registers, interconnected in the manner of the interconnections described for shift register addressing assembly 256 of FIG. 3A.

In certain embodiments, a write pointer sequence table includes rows representing a list of the rows of the backplane and columns corresponding with time intervals. This provides a template table on which a write pointer sequence may be developed or visualized; write pointer sequence table 275, FIG. 3C, and write pointer sequence table 300, FIG. 4A, are examples. An overall shift register data sequence table may have more data points than there are shift registers in the shift register addressing assembly being designed for, but this is not mandatory. Write pointer sequence table 275 of FIG. 3C and write pointer sequence table 300 of FIG. 4A represent the data propagating through the controlling shift registers (the terminology of Wp0 and so forth is for ease of reference, as the actual data are a series of 1 and 0 data values).

A tentative comprehensive write pointer sequence may next be developed. An example for consideration from write pointer sequence table 275 of FIG. 3C begins with Wp0 on row 4 at time interval 10. The write pointer sequence that includes Wp0, Wp1 and Wp2 is fully developed at time intervals 10, 11 and 12 and does not reach a full cycle until the same pattern of rows is found beginning at time interval 31. Because of the nature of a shift register addressing assembly such as that described, the number of write pointers present in the shift register addressing assembly at any given moment advantageously does not exceed the number of shift registers associated with a row of the display. This includes the controlling shift register, and each of the following non-controlling shift registers until the next controlling shift register, in the shift register addressing assembly.

One feature of the shift register approach is that a shift register data sequence is advantageously initiated at the beginning of a chain of shift registers, such as controlling shift register 253a0 of shift register addressing assembly 256, FIG. 3A. As data values propagate through individual shift registers of the shift register addressing assembly, the modulation sequence becomes more fully developed. As previously noted, this is what happens beginning at time interval 10 of write pointer sequence table 275 of FIG. 3C. This is a feature of the type of shift register addressing assembly disclosed herein, where all of the shift registers forma continuous chain in series, so that the entire shift register data sequence progresses through the chain.

Figure 5A:
Figure 5A:
Figure 5A:

FIGS. 5A, 5B and 5C present detailed shift register sequence data tables 325, 330 and 335, which depict time intervals 1 through 27 of write pointer sequence table 275 of FIG. 3C. These tables are used to illustrate additional features in the development of a shift register data sequence.

In the example illustrated, when write pointer Wp0 of the row write pattern template is initially applied at time interval 1 on row 1, it is followed by time intervals 2 and 3 during which no write pointers are applied anywhere. This is because data corresponding to the other write pointers, Wp1 and Wp2, has not yet been introduced onto the shift register addressing assembly. At time interval 4, another instance of write pointer Wp0 propagates to row 2. At time interval 5, write pointer Wp1 is introduced on row 1, thus partially establishing the shift register data sequence. Time interval 6 has no active write pointer in it, as this would be the time interval for Wp2 if the full sequence had propagated through the shift registers and later-introduced Wp2 had wrapped around, that is, propagated back into the beginning of the sequence. Time interval 7 has write pointer Wp0 on row 3, and time interval 8 has write pointer Wp1 on row 2, followed by no active write pointer in time interval 9. This is again the time interval for Wp2 if the full sequence had wrapped around.

Beginning at time interval 10, the write pointer sequence table is fully populated with all of the intended write pointers, and remains so to time interval 42, which is the end of write pointer sequence table 275. Upon propagating through the entire shift register addressing assembly, each write pointer wraps around from the last row to the first row. For example, write pointer Wp0 is positioned on row 7 at time interval 19. The next instance of write pointer Wp0 is found at time interval 22 on row 1.

In the case of write pointer sequence table 300, FIG. 4A, write pointer Wp0 does not wrap around to row 1 at time interval 22. Instead, write pointer Wp3 is found on row 1 at time interval 22. While every instance of write pointer Wp3 beginning at time interval 22 is found at a location occupied by Wp0 in the case of write pointer sequence table 275 of FIG. 3C, write pointer Wp4 is not found at points in write pointer sequence table 300 that were previously occupied by write pointer Wp1 of write pointer sequence table 275. The same holds true for write point Wp5. This is the reason for the instances at time intervals 26 and 33 where no rows are written.

The next step is to create a detailed shift register data table similar to detailed data value table 285 of FIG. 3E. This may be replicated as many times as needed. The table includes a series of column based time intervals, each one of which includes a column for each shift register group associated with the rows and in which each row of the display is allocated a row of the table. Advantageously, each row of the write pointer sequence table includes a reference to an intended row of the pixel array.

A method for starting a shift register data sequence table is to begin populating the time intervals to correspond to the write pointer sequence table. When the write pointer assembly is reset, every data value in the shift register data sequence is a zero (0). At every time interval and row where a write pointer is found, a one (1) should be written to the corresponding time interval, at a corresponding row of the shift register data sequence table.

As before, a zero corresponds to a data value which, when found on a controlling shift register, does not cause the word line for that row to be placed in condition to cause the memory circuits of that row to receive data from the bit lines, whereas a one corresponds to a data value which, when found on a controlling shift register, does cause the word line for that row to be placed in condition to cause the memory circuits of that row to receive data from the bit lines.

Thus, detailed shift register sequence data table 325 represents an intermediate stage in the development of the detailed shift register data table. Starting at time interval 1, the table includes a data value of 1 in a controlling shift register, with all other shift registers set to 0. In time interval 4, this 1 has propagated to a controlling shift register on row 2. These data values correspond to Wp0 at time interval 1 and at time interval 4. The position of the 1 between time interval 1 and time interval 4 is in the non-controlling shift registers of row 1, SReg 1 at time interval 2 and SReg 2 at time interval 3, as expected.

At time interval 5, a data value of 1 is placed at SReg 0 on row 1, which corresponds to write pointer Wp1 of write pointer sequence table 275, FIG. 3C. The 1 corresponding to write pointer Wp1 effectively terminates the single 1 of time interval 1 at row 1, because it allows new data to be written to that row. The data value of 1 on row 2 is positioned at SReg 1 in the same time interval. At time interval 6, the 1 on row 1 has moved to SReg 1 on row 1, and the 1 on row 2 has moved to SReg 2. In time interval 6, no 1 is present in any SReg 0, and therefore no row has data written to it.

At time interval 7, a data value of 1 is found on row 3 at SReg 0, which corresponds to Wp0 at that point on write pointer sequence table 275, FIG. 3C. A further data value of 1 is found on row 1 at SReg 2, which moves to SReg 0 on row 2 in time interval 8. The 1 on row 3 moves to SReg 1 in time interval 8.

At time interval 9, the 1 on row 2 moves to SReg 1, and the 1 on row 3 moves to SReg 2. At time interval 10, of detailed shift register sequence data table 330 of FIG. 5B, the data value of 1 of row 3 moves to SReg 1 of row 4, which corresponds to write pointer Wp0 of write pointer sequence table 275, FIG. 3C. A data value of 1 is also found on row 2 at SReg 2, which propagates to SReg 0 on row 3 during time interval 11. This corresponds to Wp1 at that position on write pointer sequence table 275. The data value of 1 on row 4 is now at SReg 1.

In time interval 12, a data value of 1 is inserted at row 1 on SReg 0, which corresponds to Wp2 of write pointer sequence table 275. Thus, beginning at time interval 12, the write pointer sequence is fully developed, and may be pushed down the display during subsequent clock cycles by inserting data values of 0 on row 1 at SReg 0, until the 1 corresponding to Wp0 reaches the last row of the display.

At time interval 19 of table 335 of FIG. 5C, a data value of 1 is found on row 7, which corresponds to write pointer Wp0 of write pointer sequence table 275, FIG. 3C. In the following two time intervals, a 1 is found at SReg 0 on row 6 at time interval 20, and at SReg 0 on row 4 at time interval 21.

At time interval 22, the next instance of Wp0 appears on row 1 of write pointer sequence table 275. A corresponding data value of 1 is thus introduced at SReg 0 of row 1. Although this may appear to be a matter of semantics, in one embodiment this could be a continuation of the write pointer sequence already in place (e.g., wrapping around) while in another embodiment, it may be a reinitiation of the previous write pointer sequence. One practical difference is that a reinitiation may require less digital memory that a continuation. Memory price may be more important than the physical size or the memory capacity and has not been as much of an issue recently. Larger memories may be less expensive than smaller memories.

The preceding has demonstrated how a desired write pointer sequence may be developed using a shift register addressing assembly similar to that described. The number of write pointers active at any one time in the shift register addressing assembly advantageously does not exceed the number of shift registers associated with each row, with the possible exception of the last row. Also advantageously, no two shift registers are placed in a state to initiate a transfer of data to a single row at the same time. This requires careful planning, and this specification has demonstrated how such planning may take place.

Figure 6:
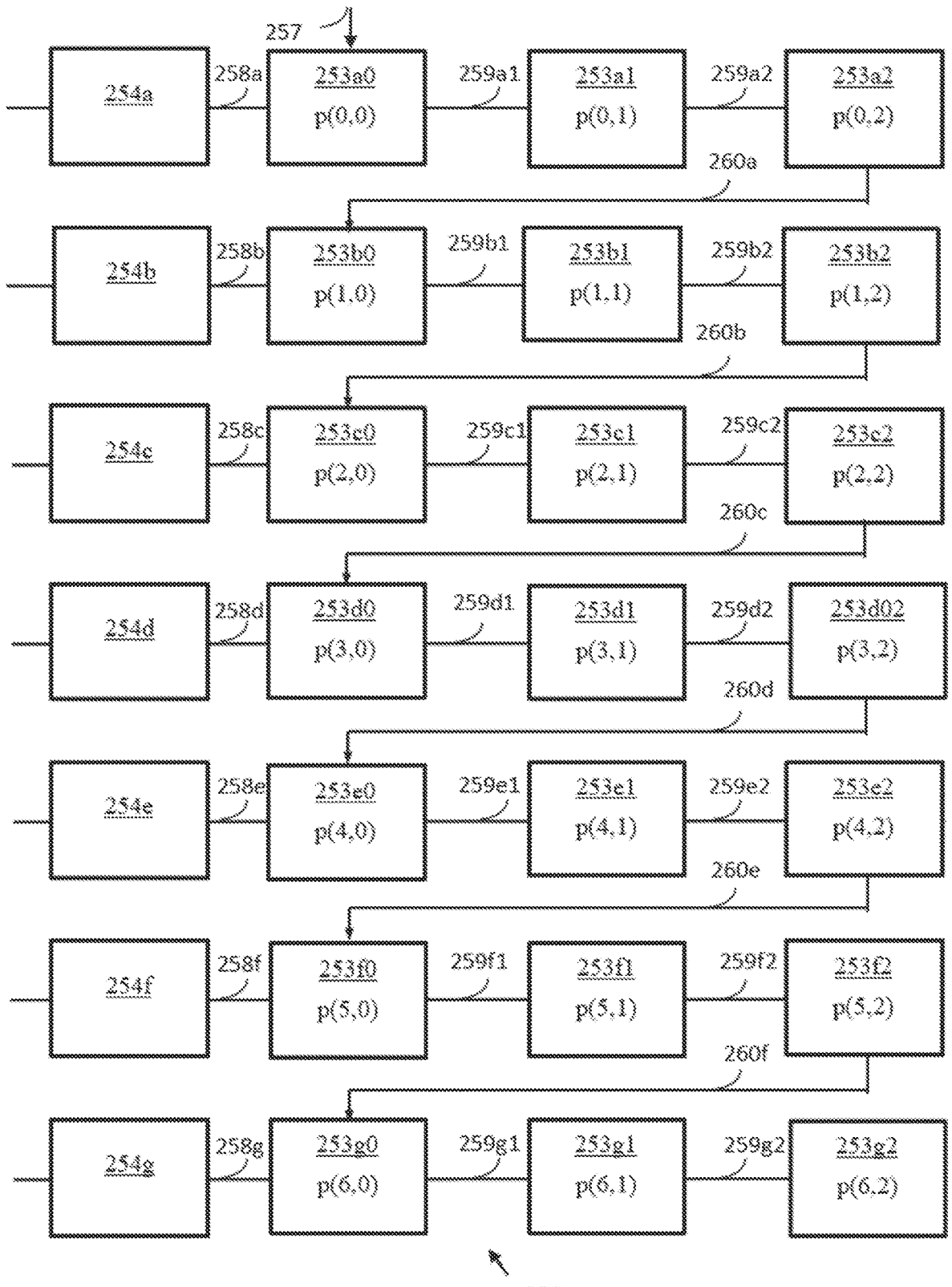
FIG. 6 depicts a detailed, schematic view of the shift register addressing assembly of FIG. 3A, in accord with one or more embodiments.

FIG. 6 depicts a detailed view of shift register addressing assembly 256 of FIG. 3A. Each shift register representation is also annotated with a value in the form of p(j, k). The convention for p(j, k) is that the letter j represents the row on which the data is found, and the letter k represents the column on which the data is found. When p(j, k) has a value of 0, the associated row driver does not cause a word line of row j to place the memory circuits of row j in a condition to receive data when asserted on a controlling shift register. When p(j, k) has a value of 1, the associated row driver does cause the memory circuits operated by the word line of row j in a condition to receive data when asserted on a controlling shift register.

As previously stated for FIG. 3A, row drivers 254a, 254b, 254c, 254d, 254e, 254f and 254g are controlled by controlling shift registers 253a0, 253b0, 253c0, 253d0, 253e0, 253f, and 253g0 respectively. This control is achieved by signals asserted on signal lines 258a, 258b, 258c, 258d, 258e, 258f and 258g (FIG. 6) respectively. Row controlling shift register 253a0 receives a series of shift register data values over input 257, which determine the state of the word line controlled by row driver 254a. The value is propagated over the shift registers of the shift register addressing assembly by a series of clock signals (not shown.) The clock moves the signal first to non-controlling shift register 253a1 over signal line 259a1, and then to non-controlling shift register 253a2 over signal line 259a2. The next clock cycle propagates the value to controlling shift register 253b0 over signal line 260a, which determines the state of row driver 254b. The next clock cycles propagate the shift register data values first to non-controlling shift register 253b1 over signal line 259b1, and then to non-controlling shift register 253b2 over signal line 259b2.

Further clock cycles propagate the shift register data values through controlling shift register 253c0 over signal line 260b, then through non-controlling shift registers 253c1 and 253c2 over signal lines 259c1 and 259c2, through controlling shift register 253d0 over signal line 260c, then through non-controlling shift registers 253d1 and 253d2 over signal lines 259d1 and 259d2, through controlling shift register 253e0 over signal line 260d, then through non-controlling shift registers 253e1 and 253e2 over signal lines 259e1 and 259e2, then through controlling shift register 253f0 over signal line 260e, then through non-controlling shift registers 253f1 and 253f2 over signal line 259f1 and 259f2, and finally onto controlling shift register 253g0 over signal line 260f.

In one embodiment, non-controlling shift registers 253g1 and 253g2 are not present, and the shift register data sequence ends when a final value of a shift register data sequence propagates to controlling shift register 253g0 over signal line 260f. If non-controlling shift registers 253g1 and 253g2 are present, the signal from controlling shift register 253g0 passes to non-controlling shift register 253g1 over signal line 259g1, and then onto non-controlling shift register 253g2 over signal line 259g2.

The separate representation of the data of a shift register, from the shift register itself, allows discussion of the nature of the data. As noted previously, the two possible values for p(j, k) are 0 and 1. In the following embodiment, a 1 represents a value that causes a word line to place pixel drive circuits of a row in a condition to receive data, whereas a 0 does not.

Referring back to the previous analysis of detailed data value table 298 of FIG. 3H, the analysis establishes that placing more than one shift register in a high (1) data state in the same column of the table, leads to a situation where two word lines on different rows are pulled high at the same time (e.g., the same data is, incorrectly, written to two rows). Therefore, it is advantageous to determine if a shift register data sequence leads to this situation, as part of a suitability evaluation for a shift register data sequence.

A method to evaluate whether or not a shift register data sequence results in two word lines being placed in a state to cause memory circuits of two corresponding rows to be placed in a state to receive data, is quite simple. The shift register data sequence values ascribed to the individual shift registers of shift register addressing assemblies such as shift register addressing assembly 256 may be analyzed according to rules described herein to make the determination.

In the example of detailed data value table 298 of FIG. 3H, the disadvantage of having shift register data values for more than one controlling shift register in the same column of table 298, be able to pull a word line to a state to permit the writing of data to more than one row over bit lines at the same time, is clearly established. The explanation for FIG. 3H also illustrates that more than one such value in a table column of non-controlling shift registers results in the same issue after a number of clock cycles, as the values from each column propagate at a uniform rate when the number of non-controlling shift registers between controlling shift registers is identical in all cases.

The following equation provides a first example for the case of shift register addressing assembly of FIG. 6, $$1 \geq \sum_{j=0}^{6} p(j, 0)$$

where j is the row on which a controlling shift register addressing assembly is located. The use of the less than or equal to sign is necessitated by the fact that not all table columns necessarily have any data values (e.g., logical 1) that place a word line into a condition to enable to memory cells of the pixel drive circuits to receive data over bit lines. The equation above may be expanded to table columns of non-controlling shift registers by switching the equation to cover p(j, 1) or p(j, 2). In logic terms, if the above equation is true, then the table column configuration conforms to the desired configuration because at any given time, no more than one row may be written to at the same time. If the above equation is false, then the table column does not conform to the desired configuration.

In a more general case, a shift register addressing assembly may include an m by n array of shift register circuits, wherein m denotes a number of rows of shift register circuits and n represents a number of table columns of shift register circuits. That is, each row contains exactly one controlling shift register, and most rows include additional non-controlling shift registers. The number of non-controlling shift registers between a first controlling shift register and the next controlling shift register is the same. In certain embodiments, the last row of shift register circuits includes only a controlling shift register circuit. In other embodiments, the number of non-controlling shift registers after a last controlling shift register is the same as on all other rows of shift registers.

A more general version of the equation above for evaluation of the shift register data values on a shift register addressing assembly that includes m rows by n table columns (e.g., columns of shift registers, not columns of pixels or memory cells in an associated array) is presented below.

$$1 \geq \sum_{j=0}^{m-1} p(j, k)$$

In this case, the evaluation must be run for each table column of the shift register addressing assembly. In all instances, there are controlling shift registers for each row. In the previously mentioned embodiments wherein there are no non-controlling shift registers after the last controlling shift registers, there are m-1 rows with non-controlling shift registers. Therefore, the summation for those rows must end at m-2 rather than m-1.

Because of the nature of the introduction of the shift register data sequence onto the shift register addressing assembly, it is important to select a time interval for evaluation of conflicts. A first point for evaluation occurs when the modulation sequence is first fully introduced. An example of this is found in FIGS. 3C, 3D and 3E at time slot 12. In write pointer sequence table 275, FIG. 3C, time interval 12 is the first time interval at which all three write pointers of write pointer sequence table 275 are present at the same time, Wp0 having appeared in time interval 10, Wp1 in time interval 11 and Wp2 in time interval 12.

During time intervals 10, 11 and 12 of shift register data sequence table 280 of FIG. 3D, the sequence clearly has only one controlling shift register in a position to operate a word line in each time interval. During each successive time interval, the data values of the shift register data table for succeeding time intervals shifts one digit to the right. Detailed data value table 285 of the shift registers of FIG. 3E, presents a more detailed view of time interval 12. Inspection of each table column reveals that only one shift register data value in each column is a 1, and only SReg 0 for row 1-252a is in a position to operate a word line. By inspection, the sum of the data states for each column is 1, which passes the evaluation criteria for each column. Further inspection of the succeeding time intervals of detailed data value table 285 of FIG. 3D, of detailed data value table 290 of FIG. 3F, and of detailed data value table 295 of FIG. 3G, reveals that the criteria of the evaluation equation is met in every case. During time slot 33, the previous sequence beginning at time interval 22 is reinitiated, with no change to the elements of the shift register data sequence, as shown in shift register data sequence table 280 of FIG. 3D.

The shift register data sequence of shift register data sequence table 280 of FIG. 3D repeats itself, and only generates the same number of bit planes as the number of columns in the shift register addressing assembly. Write pointer sequence table 300 of FIG. 4A uses 6 write pointer Wp0 through Wp5 to create six bit planes, as previously described.

The shift register data sequence of write pointer sequence table 300 of FIG. 4A is identical to previously presented write pointer sequence table 275 of FIG. 3C at time intervals 1 through 21. For example, at time interval 22 of write pointer sequence table 300, write pointer Wp3 is found on row 1-RW 252a while write pointer Wp0 is found at the same position, on the same row, of write pointer sequence table 275. Likewise, write pointer Wp1, at time interval 23 in write pointer sequence table 300, is located at the same position as write pointer Wp1 at time interval 23 in write pointer sequence table 275. The same is true of write pointer Wp2 at time interval 24 of write pointer sequence table 300 and write pointer Wp2 at time interval 24 of write pointer sequence table 275.

In general, the position of write pointer Wp0 of write pointer sequence table 300 correlates to the position of write pointer Wp3 of write pointer sequence table 275 at time intervals 25, 28, 31, 34, 37 and 40. Write pointer Wp4 of write pointer sequence table 300 at time intervals 29, 32, 35, 38 and 41 does not correlate in row position to write pointer Wp1 of write pointer sequence table 275 at the same time intervals, and write pointer Wp5 of write pointer sequence table 300 at time intervals 36, 39 and 42 does not correlate in row position to write pointer Wp2 at the same time intervals, in write pointer sequence table 275.

A candidate time interval of write pointer sequence table 300 to perform the evaluation is time interval 36, as all of the final three write pointers are developed there. Inspection of detailed data value table 315 for time interval 36 of FIG. 4D shows that only one shift register data value of 1 is in each of column SReg 0, SReg 1 and SReg 2 which means that the logic value for each column is true for the equation above.

In fact, each time interval of a candidate shift register data sequence may be analyzed in turn, and the results reviewed using commonly available programming techniques or other analysis tools, such as a spreadsheet.

The suitability of a conforming shift register data sequence to generate a desired gray scale for any intended operation, is often best determined initially by testing a candidate data sequence using a calibrated data collecting system, together with visual inspection by an experienced observer. Suitable test equipment is available from a variety of sources. Specific gray levels are met by choosing which bit planes of the available bit planes are to be turned on, and which ones are to be left off.

The reaction of LEDs to pulse width modulation is highly linear provided the driving voltage is constant. The reaction of a liquid crystal cell to pulse width modulation is more complex and depends heavily on the type of liquid crystal layer and the manner in which the cell is constructed. The material and alignment requirements for liquid crystal cells are well known in the art and are not repeated here.

There are literally tens of thousands of published papers and many issued patents on the topic of liquid crystal cells. As a single example, a review of *Mixed mode twisted nematic liquid crystal cells for reflective displays*, Applied Physics Letters 68, volume 11, page 1455 is recommended. Major universities and institutions such as the Liquid Crystal Institute at Kent State University and CREOL, The College of Optics and Physics, at the University of Central Florida are involved in research on this topic.

Those of skill in the art may recognize variations on the methods described herein. Upon reading and understanding the present disclosure, one skilled in the art will be able to automate the process for shift register data sequence development using common software development tools.

It is conceived that the range of gray scale values available from the present disclosure may be improved by using analog pixels rather than digital pixels, each of which may be set to a limited range of preselected values. The preselected values may be independent of the row, and may differ for adjacent pixels, without limitation.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

Combination of Features

Features described above as well as those claimed below may be combined in various ways without departing from the scope hereof. The following enumerated examples illustrate some possible, non-limiting combinations:

(A1) A backplane configured to drive a display includes: an array of pixel drive circuits, organized as a plurality of rows and a plurality of columns, each of the pixel drive circuits including a memory circuit operable to receive and store a display value; a plurality of word lines, wherein each word line connects with the pixel drive circuits of a corresponding one of the rows; a plurality of bit lines, wherein each bit line is operable to present the display value to all of the pixel drive circuits along a corresponding one of the columns; and at least one shift register addressing assembly that includes: a plurality of controlling shift registers, each one of the controlling shift registers having an output operable to control a different one of the plurality of word lines; a plurality of non-controlling shift registers serially connected with the plurality of controlling shift registers to form a shift register chain, wherein a group of at least one of the plurality of non-controlling shift registers is logically positioned between sequential ones of the plurality of controlling shift registers; and a sequence input of a first one of the plurality of controlling shift registers for receiving a shift register data sequence that in operation controls selection of the plurality of word lines.

(A2) In embodiments of (A1), a first number of non-controlling shift registers in any one group is equal to a second number of non-controlling shift registers in any other group.

(A3) In either of embodiments (A1) or (A2), a first number of pixel drive circuits on one of the rows operable by a first one of the word lines is the same as a second number of pixel drive circuits on any other row operable by ones of the word lines.

(A4) In any of embodiments (A1)-(A3), the pixel drive circuits of each row operable by all word lines controllable by shift registers of the same shift register addressing assembly are arrayed across all of the columns of the array.

(A5) In any of embodiments (A1)-(A4), where the plurality of word lines are configured to drive even rows of the display, the backplane further includes: a second shift register addressing assembly that includes: a plurality of controlling shift registers, each one of the controlling shift registers having an output operable to control a different one of a plurality of word lines of the display to drive odd rows of the display; a plurality of non-controlling shift registers serially connected with the plurality of controlling shift registers to form a shift register chain, wherein a group of at least one of the plurality of non-controlling shift registers is logically positioned between sequential ones of the plurality of controlling shift registers; and a sequence input of a first one of the plurality of controlling shift registers for receiving a shift register data sequence that is operable to control selection of the plurality of word lines.

(A6) In any of embodiments (A1)-(A5), the memory circuit of each of the pixel drive circuits corresponding to at least part of one of the rows is selectively enabled, by action of one of the word lines that is controlled by one of the controlling shift registers, to receive the display value presented by the respective bit line of the memory circuit; each pixel drive circuit can produce an output that is operable to drive a display element of the display according to the display value stored in the memory circuit of the pixel drive circuit; a first shift register of each shift register addressing assembly is operable to receive the data values from the sequence input, and the data values propagate through the shift register chain over successive cycles of a clock.

(A7) In any of embodiments (A1)-(A6), wherein, in operation, the display values stored in the memory circuits are single bits, such that a logical 1 stored in each memory circuit places the corresponding pixel drive circuit in an on state, and a logical 0 stored in the memory circuit places the corresponding pixel drive circuit in an off state.

(A8) In any of embodiments (A1)-(A7), wherein, in operation, the display values stored in the memory circuits are analog values.

(A9) In any of embodiments (A1)-(A8), wherein, in operation, the data values received by the first one of the plurality of controlling shift registers are arranged in a predetermined sequence that, as the data values propagate through the shift register chain, does not cause more than one row to enable the memory circuits of the corresponding pixel drive circuits on that row to receive and store display values.

(B1) A method of operating a two-dimensional display of display elements includes: providing a backplane that drives the two-dimensional display, the backplane comprising: a two-dimensional array of pixel drive circuits, organized as a plurality of rows and a plurality of columns, wherein each of the pixel drive circuits: includes a corresponding memory circuit that is operable to receive and store a display value, and in operation, can produce an output that drives a display element of the two-dimensional display, according to the display value stored in the corresponding memory circuit; a plurality of word lines, wherein each word line connects with the pixel drive circuits of a corresponding one of the rows; a plurality of bit lines, wherein each bit line is operable to present the display value to all of the pixel drive circuits along a corresponding one of the columns; and a shift register addressing assembly that includes: a plurality of controlling shift registers, each one of the controlling shift registers being operable to control a different word line of the plurality of word lines according to a data value in the controlling shift register, wherein, in operation, the memory circuits of the pixel drive circuits corresponding to at least part of one of the rows are selectively enabled, by action of one of the word lines, to receive ones of the display values presented by the respective bit lines of the memory circuits; and a plurality of non-controlling shift registers that are not operable to control any of the word lines, wherein the controlling shift registers and the non-controlling shift registers are serially connected in a shift register chain with groups of one or more of the non-controlling shift registers logically disposed within the shift register chain, between successive ones of the controlling shift registers, such that the data values propagate through both the controlling and non-controlling shift registers in response to successive cycles of a clock signal; the method further including: inputting, at each cycle of the clock signal, one data value from a shift register data sequence to a first controlling shift register of the plurality of controlling shift registers, wherein the shift register data sequence is arranged to cause a maximum of one of the controlling shift registers to operate its respective word line during any one period of the clock signal; and providing successive cycles of the clock signal to the controlling shift registers and non-controlling shift registers to propagate the data values through the shift register chain.

(B2) In embodiments of (B1), a first number of non-controlling shift registers in any one group is equal to a second number of non-controlling shift registers in any other group.

(B3) In either of embodiments (B1) or (B2), a first number of pixel drive circuits on one of the rows operated by a first one of the word lines controlled by one of the shift registers is the same as a second number of pixel drive circuits on any other row operated by ones of the word lines controlled by other shift registers of the same shift register addressing assembly.

(B4) In any of embodiments (B1)-(B3), the pixel drive circuits of each row operated by all word lines controlled by shift registers of the same shift register addressing assembly are arrayed across all of the columns of the two-dimensional array.

(B5) In any of embodiments (B1)-(B4), wherein, in operation, the memory circuits of the pixel drive circuits corresponding to at least part of one of the rows are selectively enabled, by action of one of the word lines that is controlled by one of the controlling shift registers, to receive ones of the display values presented by the respective bit lines of the memory circuits; each pixel drive circuit produces an output that is operable to drive the display element of the two-dimensional display according to the display value stored in the corresponding memory circuit of the pixel drive circuit; a first shift register of each shift register addressing assembly is operable to receive the data values from a sequence input, and the data values propagate through the shift register chain over successive cycles of a clock.

(B6) In any of embodiments (B1)-(B5), wherein, in operation, the display values stored in the memory circuits are single bits, such that a logical 1 stored in each memory circuit places the corresponding pixel drive circuit in an on state, and a logical 0 stored in the memory circuit places the corresponding pixel drive circuit in an off state.

(B7) In any of embodiments (B1)-(B6), wherein, in operation, the display values stored in the memory circuits are analog values.

(B8) In any of embodiments (B1)-(B7), wherein, in operation, the data values received by the first controlling shift register are arranged in a predetermined sequence that, as the data values propagate through the shift register chain, does not cause more than one row to enable the memory circuits of the corresponding pixel drive circuits on that row to receive and store display values.

What is claimed is:

1. A backplane configured to drive a display, comprising:
    an array of pixel drive circuits, organized as a plurality of rows and a plurality of columns, each of the pixel drive circuits including a memory circuit operable to receive and store a display value;
    a plurality of word lines, wherein each word line connects with the pixel drive circuits of a corresponding one of the plurality of rows;
    a plurality of bit lines, wherein each bit line is operable to present the display value to all of the pixel drive circuits along a corresponding one of the plurality of columns; and
    at least one shift register addressing assembly that includes:
        a plurality of controlling shift registers, each one of the plurality of controlling shift registers having an output operable to control a different one of the plurality of word lines;
        a plurality of non-controlling shift registers serially connected with the plurality of controlling shift registers to form a shift register chain, wherein a group of at least one of the plurality of non-controlling shift registers is logically positioned between sequential ones of the plurality of controlling shift registers; and
        a sequence input of a first one of the plurality of controlling shift registers for receiving a shift register data sequence that, in operation, controls non-contiguous selection of the plurality of word lines.

2. The backplane of claim 1, wherein a first number of non-controlling shift registers in any one group is equal to a second number of non-controlling shift registers in any other group.

3. The backplane of claim 1, wherein a first number of pixel drive circuits on a row of the plurality of rows operable by a first word line of the plurality of word lines is the same as a second number of pixel drive circuits on any other row operable by word lines of the plurality of word lines.

4. The backplane of claim 1, wherein the pixel drive circuits of each row operable by all word lines controllable by shift registers of the same shift register addressing assembly are arrayed across all of the plurality of columns of the array.

5. The backplane of claim 1, wherein the plurality of word lines is configured to drive even rows of the display, the backplane further comprising:
    a second shift register addressing assembly that includes:
        a plurality of controlling shift registers, each one of the plurality of controlling shift registers having an output operable to control a different one of a plurality of word lines of the display to drive odd rows of the display;

a plurality of non-controlling shift registers serially connected with the plurality of controlling shift registers to form a shift register chain, wherein a group of at least one of the plurality of non-controlling shift registers is logically positioned between sequential ones of the plurality of controlling shift registers; and a sequence input of a first one of the plurality of controlling shift registers for receiving a shift register data sequence that is operable to control selection of the plurality of word lines.

6. The backplane of claim 1, wherein, in operation:

the memory circuit of each of the pixel drive circuits corresponding to at least part of one of the plurality of rows is selectively enabled, by action of one of the plurality of word lines that is controlled by one of the plurality of controlling shift registers, to receive the display value presented by a respective bit line of the memory circuit;

each pixel drive circuit can produce an output that is operable to drive a display element of the display according to the display value stored in a respective memory circuit;

a first shift register of each shift register addressing assembly is operable to receive data values from the sequence input; and the data values propagate through the shift register chain over successive cycles of a clock.

7. The backplane of claim 6, wherein, in operation, respective display values stored in respective memory circuits of the array of pixel drive circuits are single bits, such that a logical 1 stored in each memory circuit places a corresponding pixel drive circuit in an on state, and a logical 0 stored in the memory circuit places the corresponding pixel drive circuit in an off state.

8. The backplane of claim 6, wherein, in operation, respective display values stored in respective memory circuits are analog values.

9. The backplane of claim 6, wherein, in operation, the data values received by the first one of the plurality of controlling shift registers are arranged in a predetermined sequence that, as the data values propagate through the shift register chain, does not cause more than one row to enable respective memory circuits of corresponding pixel drive circuits on that row to receive and store display values.

10. A method of operating a two-dimensional display of display elements, comprising:

providing a backplane that drives the two-dimensional display, the backplane comprising:

a two-dimensional array of pixel drive circuits, organized as a plurality of rows and a plurality of columns, wherein each of the pixel drive circuits:

includes a corresponding memory circuit that is operable to receive and store a respective display value, and in operation, can produce an output that drives a display element of the two-dimensional display, according to the respective display value stored in the corresponding memory circuit;

a plurality of word lines, wherein each word line connects with the pixel drive circuits of a corresponding one of the plurality of rows;

a plurality of bit lines, wherein each bit line is operable to present the respective display value to all of the pixel drive circuits along a corresponding one of the plurality of columns; and a shift register addressing assembly that includes:

a plurality of controlling shift registers, each one of the plurality of controlling shift registers being operable to control a different word line of the plurality of word lines according to a respective data value in a corresponding controlling shift register, wherein, in operation, respective memory circuits of the pixel drive circuits corresponding to at least part of one of the plurality of rows are selectively enabled, by action of one of the plurality of word lines, to receive ones of respective display values presented by respective bit lines of the respective memory circuits; and a plurality of non-controlling shift registers that are not operable to control any of the plurality of word lines, wherein the plurality of controlling shift registers and the plurality of non-controlling shift registers are serially connected in a shift register chain with groups of one or more of the plurality of non-controlling shift registers logically disposed within the shift register chain, between successive ones of the plurality of controlling shift registers, such that the respective data values propagate through both the plurality of controlling shift registers and the plurality of non-controlling shift registers in response to successive cycles of a clock signal;

the method further comprising:

inputting, at each cycle of the clock signal, one data value from a shift register data sequence to a first controlling shift register of the plurality of controlling shift registers, the shift register data sequence including a plurality of write pointers, wherein the shift register data sequence is arranged to cause a maximum of one of the plurality of controlling shift registers to operate its respective word line during any one period of the clock signal; and providing successive cycles of the clock signal to the plurality of controlling shift registers and the plurality of non-controlling shift registers to propagate the respective data values through the shift register chain.

11. The method of claim 10, wherein a first number of non-controlling shift registers in any one group is equal to a second number of non-controlling shift registers in any other group.

12. The method of claim 10, wherein a first number of pixel drive circuits on one of the plurality of rows operated by a first one of the plurality of word lines controlled by one of the plurality of controlling shift registers is the same as a second number of pixel drive circuits on any other row operated by ones of the plurality of word lines controlled by other shift registers of the same shift register addressing assembly.

13. The method of claim 10, wherein the pixel drive circuits of each row operated by all word lines controlled by shift registers of the same shift register addressing assembly are arrayed across all of the plurality of columns of the two-dimensional array.

14. The method of claim 10, wherein, in operation:

respective memory circuits of the pixel drive circuits corresponding to at least part of one of the plurality of rows are selectively enabled, by action of one of the plurality of word lines that is controlled by one of the plurality of controlling shift registers, to receive ones of the respective display values presented by the respective bit lines of the respective memory circuits;

each pixel drive circuit produces an output that is operable to drive the display element of the two-dimensional display according to the respective display value stored in the corresponding memory circuit;

a first shift register of each shift register addressing assembly is operable to receive the respective data values from a sequence input; and the respective data values propagate through the shift register chain over successive cycles of a clock.

15. The method of claim 14, wherein, in operation, the respective display values stored in the respective memory circuits are single bits, such that a logical 1 stored in each memory circuit places a corresponding pixel drive circuit in an on state, and a logical 0 stored in each memory circuit places the corresponding pixel drive circuit in an off state.

16. The method of claim 14, wherein, in operation, the respective display values stored in the respective memory circuits are analog values.

17. The method of claim 14, wherein, in operation, data values of the respective data values received by the first controlling shift register are arranged in a predetermined sequence that, as the respective data values propagate through the shift register chain, does not cause more than one row to enable the respective memory circuits of corresponding pixel drive circuits on that row to receive and store display values.

18. The backplane of claim 1, wherein the shift register data sequence includes a plurality of write pointers.

19. The method of claim 10, wherein operation of the plurality of word lines by the shift register data sequence is non-contiguous.

* * * * *